United States Patent [19]

Uchida et al.

[11] Patent Number: 4,838,693

[45] Date of Patent: Jun. 13, 1989

[54] METHOD AND APPARATUS FOR SETTING A GAP BETWEEN FIRST AND SECOND OBJECTS TO A PREDETERMINED DISTANCE

[75] Inventors: Norio Uchida; Yoriyuki Ishibashi, both of Yokohama; Ryoichi Hirano, Tokyo; Masayuki Masuyama, Kumagaya; Hiroaki Shimozono, Tokyo, all of Japan

[73] Assignees: Kabushiki Kaisha Toshiba, Kawasaki; Tokyo Kogaku Kikai Kabushiki Kaisha, Tokyo, both of Japan

[21] Appl. No.: 60,601

[22] Filed: Jun. 11, 1987

[30] Foreign Application Priority Data

Jun. 11, 1986 [JP] Japan ................................ 61-135172
Sep. 11, 1986 [JP] Japan ................................ 61-212566
Nov. 29, 1986 [JP] Japan ................................ 61-284586
Mar. 31, 1987 [JP] Japan ................................ 62-78701

[51] Int. Cl.$^4$ .............................................. G01B 9/02
[52] U.S. Cl. ...................................... 356/356; 356/363
[58] Field of Search .............. 356/355, 556, 363, 400, 356/401

[56] References Cited

U.S. PATENT DOCUMENTS 4,371,264 2/1983 Lacombat et al. ................... 356/363
4,596,467 6/1986 Bartelt ............................ 356/356 X

FOREIGN PATENT DOCUMENTS 61-116837 6/1986 Japan .

OTHER PUBLICATIONS

Y. Tarui, "VLSI Technology" Springer Verlag, Berlin 1986, pp. 135–137 and pp. 144–147. (English Translation of the Original Japanese Edition, 1981).

Primary Examiner—Davis L. Willis
Assistant Examiner—Matthew W. Koren
Attorney, Agent, or Firm—Oblon, Fisher, Spivak, McClelland & Maier

[57] ABSTRACT

According to this invention, a method and apparatus for setting a gap to a predetermined distance between a mask and a wafer facing each other, are arranged as follows. First and second diffraction grating are formed on a mask and a wafer. The first diffraction grating is one-dimensional type and has parallel bars extending in a predetermined direction. The second diffraction grating is one-dimensional type and has parallel bars extending in a direction perpendicular to the predetermined direction. The second diffraction grating may be two-dimensional type having cross-bars. Laser beam is radiated from a light source onto the first diffraction grating. The light beams diffracted and transmitted through the first diffraction grating are transferred to the second diffraction grating. The light beams diffracted and reflected by the second diffraction grating are transferred to the first diffraction grating. The light beams are diffracted and transmitted through the first diffraction grating. Is detected, one of the diffracted light beams which are not oriented along a predetermined. The light beams reflected and diffracted by the surface of the first diffraction grating is transferred only by the prdetermined plane. Therefore, detected and diffracted light beam does not interfere with reflected light beams. The gap between the mask and the wafer can be adjusted and can be set to a predetermined distance.

40 Claims, 17 Drawing Sheets

F I G. 5
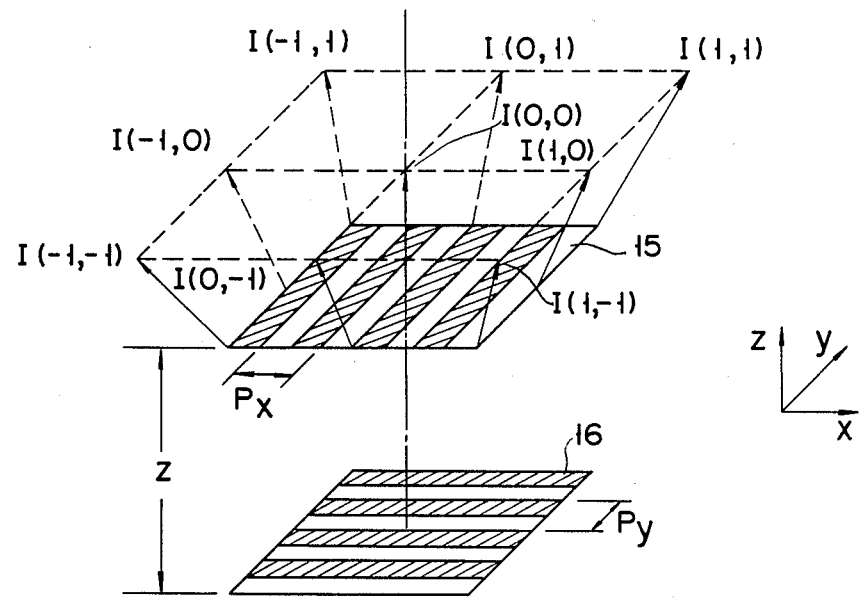

F I G. 11A
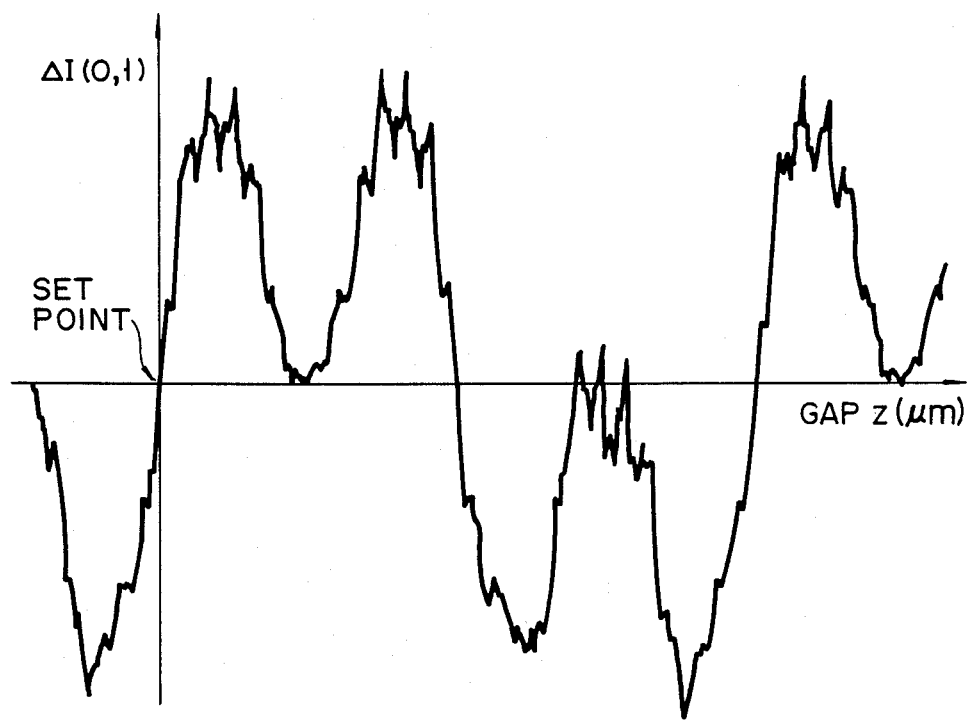
F I G. 11B
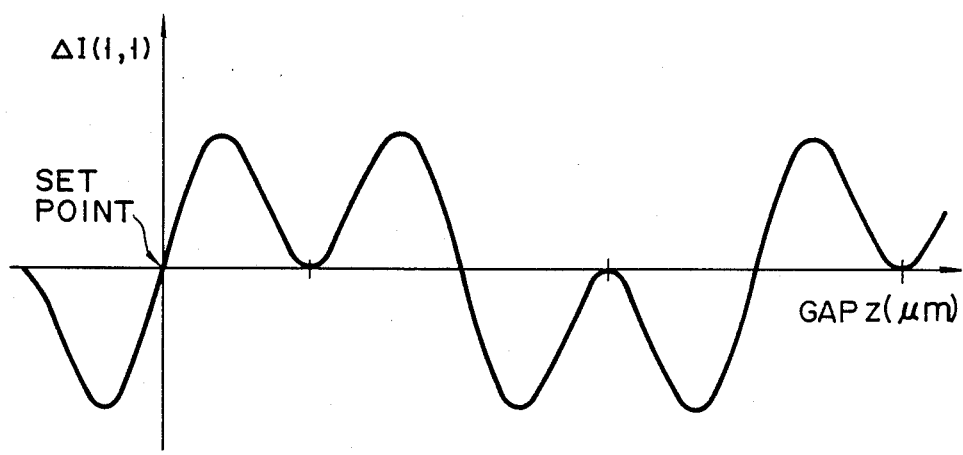

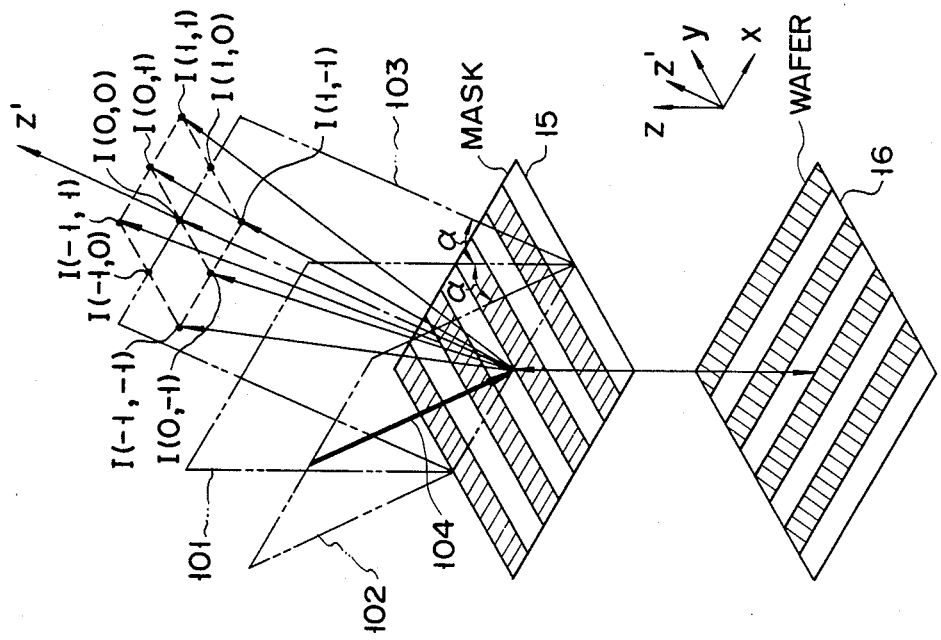
F I G. 23

METHOD AND APPARATUS FOR SETTING A GAP BETWEEN FIRST AND SECOND OBJECTS TO A PREDETERMINED DISTANCE

BACKGROUND OF THE INVENTION

The present invention relates to a method and apparatus for setting a gap between first and second objects to a predetermined distance and, more particularly, a method and apparatus for setting a gap between a mask and a wafer to a predetermined distance when the image of a circuit pattern is transferred to a wafer.

In the process of manufacturing a semiconductor device such as a VLSI, a circuit pattern is normally exposed on a wafer, by means of an exposure apparatus. Using this apparatus, a circuit pattern preformed on a mask is irradiated with X-rays, which causes an image of the circuit pattern to be transferred to a wafer. Before the circuit pattern is transferred, a gap between the mask and the wafer must be accurately set to a predetermined distance.

A method for setting a gap between a mask and a wafer is disclosed in Japanese Patent Disclosure (Kokai) No. 61-116837. In this method, a diffraction grating is used. More specifically, as is shown in FIG. 1, one-dimensional diffraction grating 2 is formed on mask 1, and reflection surface 4 is formed of wafer 3. When laser beam is radiated onto the upper surface of mask 1, light beams diffracted by and passing through diffraction grating 2 of mask 1 are reflected by reflection surface 4 of wafer 3, and are diffracted again by diffraction grating 2 of mask 1. Among these diffracted light beams, diffracted light beam $I_n(+1)$ of the +1st order and diffracted light beam $I_n(-1)$ of $-1$st order are measured. The result of this measurement is indicated by the broken curve in FIG. 2. More specifically, the relationship between the intensity of diffracted light and the distance of a gap corresponds to a periodic function having a period of $P^2/\lambda$ (when P is the pitch of diffraction grating 2, and $\lambda$ is a wavelength of laser beams). The distance of a gap between mask 1 and wafer 3 is adjusted so that intensity $I_n$ of diffracted light beams corresponds to the peak value of the periodic function. Thus, a gap between mask 1 and wafer 3 can be set to a predetermined value.

However, the diffraction grating of mask 1 also serves as a reflector type diffraction grating. For this reason, the diffracted light beams of the $\pm 1$st orders, which are diffracted along the path of mask $1 \rightarrow$ wafer $3 \rightarrow$ mask 1, interfere with the reflected diffracted light beam of the 1st order, reflected by the upper surface of the mask. If a distance of a gap between the mask and the wafer is z, the diffracted light beams of the $+1$st orders have an optical path difference of 2z, with respect to the reflected diffracted light beam of the 1st order. If $2z=n\lambda$ (n is an integer), the diffracted light beams of the $\pm 1$st orders interfere with the reflected diffracted light beams of the 1st order. For this reason, as is shown in FIG. 2, the relationship between the intensity of diffracted light beams and the distance of the gap becomes a nonuniform periodic function having a period $\lambda/2$. Consequently, it is then difficult to adjust the size of a gap between the mask and the wafer.

SUMMARY OF THE INVENTION

It is an object of the present invention to provide a method and apparatus for accurately setting a gap between first and second objects, to a predetermined value.

It is another object of the present invention to provide a method and apparatus for accurately setting a gap between a mask and a wafer, to a predetermined value, without creating interference between reflected diffracted light beams, reflected by a diffraction grating of the mask, and diffracted light beams for detecting the distance of the gap between the mask and the wafer.

According to the present invention, the method and the arrangement of an apparatus for setting a distance of a gap between a mask and a wafer are as follows.

A first diffraction grating is formed on a first object. The first diffraction grating is a one-dimensional type grating, and its stripes (bars) extend in a first direction. The first direction is perpendicular to a first plane, to which a second plane inclines at a predetermined angle ($\alpha$), said second plane being symmetrical to a third plane with respect to said first plane. A second diffraction grating, also one-dimensional, is formed on a second object, such that its stripes (bars) extend in a direction perpendicular to the first direction. Laser beams are radiated from a light source onto the first diffraction grating. The incident light beam has an optical present in the second plane. The light beam is diffracted and transmitted through the first diffraction grating, and first diffracted light beams are emerged from said first diffraction grating. The first diffracted light beams are transferred to the second diffraction grating, so that the first diffracted light beams are diffracted and reflected by the second diffraction grating, and second diffracted light beams are emerged from the second diffraction grating. The second diffracted light beams are transferred to the first diffraction grating, so that the second diffracted light beams are diffracted and transmitted through the first diffraction grating, and third diffracted light beams are emerged from said first diffraction grating. Some of the third diffracted light beams are transferred in the third plane, and the other third diffracted light beams are transferred in any planes other than the third plane. One of the other third diffracted light beams is detected. In accordance with the intensity of the detected diffracted light beam, the distance of the gap between the first and second objects is adjusted, so that the gap is set to a predetermined distance.

The stripes (bars) of the first diffraction grating are perpendicular to those of the second diffraction grating. The first and second diffraction gratings serve as double diffraction gratings. For this reason, the third diffracted light beams which is diffracted along a path of first diffraction grating $\rightarrow$ second diffraction grating $\rightarrow$ first diffraction grating, appear as a two-dimensional pattern. On the other hand, the light beams reflected and diffracted by the surface of the first diffraction grating, are transferred only by the third plane. In this invention, one of the third diffracted light beams is transferred in any planes other than the third plane, and can be detected. For this reason, the detected and diffracted light beam will not interfere with reflected and diffracted light beams. Thus, the gap between the first and second objects can be accurately set to a predetermined value. In this invention, a two-dimensional diffraction grating can be used as the second diffraction grating. The present invention can be applied to a method and apparatus for setting the gap between a mask and a wafer to a predetermined value, in an exposure apparatus. Therefore, the first object can be a mask and the second object can be a wafer.

BRIEF DESCRIPTION OF THE DRAWINGS

FIG. 5 is a perspective view showing a pattern of light beams diffracted by the diffraction gratings of the mask and the wafer;

FIGS. 11A and 11B are graphs showing the relationship between a difference in the intensities of diffracted light beams and the distance of the gap between the mask and the wafer, the diffracted light beams being detected by the method based on the second embodiment of the present invention;

FIGS. 23 and 24 are perspective views, according to a fifth embodiment of the present invention.

DETAILED DESCRIPTION OF THE PREFERRED EMBODIMENTS

Figure 1:
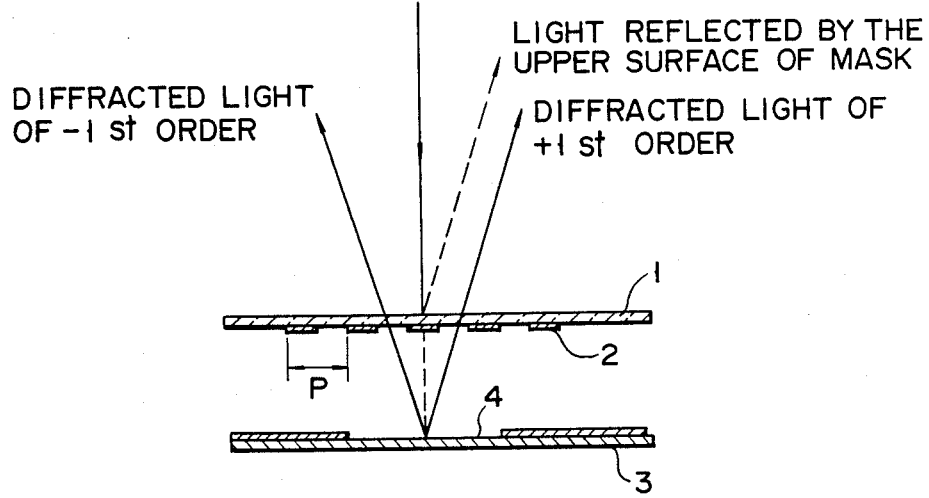
FIG. 1 is a view schematically illustrating the principle of a method for setting of a gap between a mask and a wafer to a predetermined distance, according to the prior art.
Figure 2:
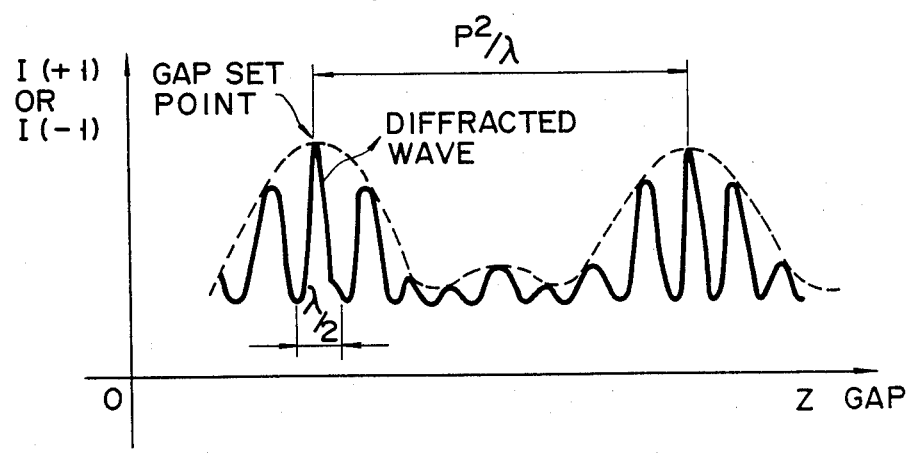
FIG. 2 is a graph showing the detection result obtained by the method illustrated in FIG. 1, and showing the relationship between the intensity of diffracted light beams and the distance of a gap, according to the prior art.
Figure 3:
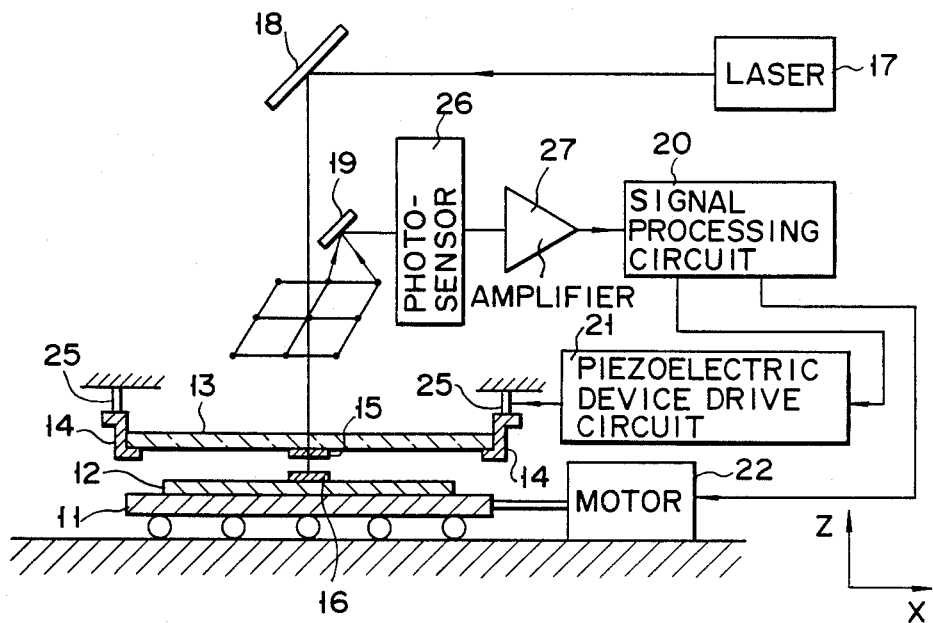
FIG. 3 is a diagram schematically illustrating an apparatus for setting a gap between a mask and a wafer to a predetermined distance, according to a first embodiment of the present invention.

An apparatus for setting a gap between a mask and a wafer to a predetermined distance, shown in FIG. 3, has wafer table 11 which is movable in the x direction. Wafer 12 is placed on the upper surface of wafer table 11. Mask 13 is arranged above wafer 12. Mask 13 and wafer 12 are separated at a predetermined distance in the z direction. Mask 13 is supported by holder 14. Holder 14 is supported by piezo-electric device 25. When piezo-electric device 25 is driven, mask 13 is moved in the z direction.

Figure 4:
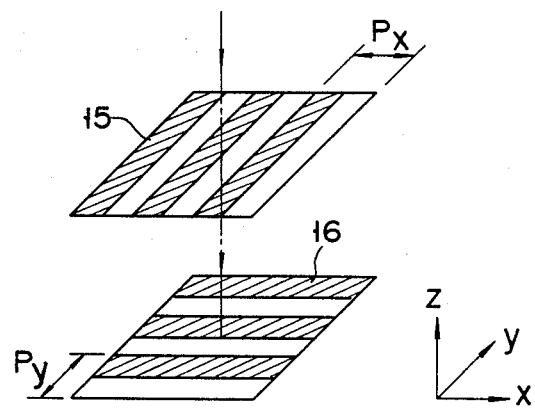
FIG. 4 is a perspective view showing first and second diffraction gratings respectively formed on a mask and a wafer in the apparatus shown in FIG. 3.

Transmission type first diffraction grating 15 is formed on mask 13, as is shown in FIG. 4. Reflection type diffraction grating 16 is formed on the upper surface of wafer 12. First and second diffraction gratings 15 and 16 are arranged facing each other. First diffraction grating 15 is a one-dimensional type grating, and has parallel bars (stripes) extending in the y direction. Second diffraction grating 16 is also a one-dimensional type, and has parallel bars (stripes) extending in the x direction (aligning direction). More specifically, the bars of these diffraction gratings extent perpendicular to each other.

The apparatus also comprises laser 17 for emitting coherent laser beam, photosensor 26 for detecting diffracted light beams, so as to convert it into an electrical signal, signal processing circuit 20 for processing the electrical signal, so as to produce a control signal, and piezo-electric device drive circuit 21 for supplying a current to piezo-electric device 25, in accordance with the control signal.

With this apparatus, the gap between the mask and the wafer is set to a predetermined distance as follows:

Laser beam emitted from laser 17 is radiated onto mirror 18. The light beams reflected by mirror 18 are radiated onto first diffraction grating 15. The light beams which are diffracted by diffraction grating 15 and pass therethrough are transferred to second diffraction grating 16. The light beams which are diffracted and reflected by diffraction grating 16 are transferred to first diffraction grating 15. The light beams which are diffracted by diffraction grating 15 and pass therethrough are transferred to mirror 19. In this manner, first and second diffraction gratings serve as double diffraction gratings. Of the light beams diffracted by diffraction gratings 15 and 16, light beams in a specific direction, are guided to photosensor 26. More specifically, an inclination angle of mirror 19 is adjusted, so that the diffracted light beams guided to photosensor 26 are picked up thereby. The diffracted light beams in the specific direction are converted to an electrical signal corresponding to the intensity thereof, by photosensor 26. The electrical signal is supplied to signal processing circuit 20 through amplifier 27, and is processed thereby. Processing circuit 20 produces a piezo-electric device drive signal. This drive signal is supplied to piezoelectric device drive circuit 21 which, in turn, supplies a current to piezo-electric device 25. Piezoelectric device 25 is thus driven, and the distance of a gap between mask 13 and wafer 12 is adjusted. In other words, the gap between mask 13 and wafer 12 is set to a predetermined distance. This setting apparatus also includes motor 22 for moving wafer 12 in the x direction (aligning direction).

When laser beams are diffracted along the path of first diffraction grating 15→second diffraction grating 16→first diffraction grating 15, first and second diffraction gratings 15 and 16 serve as double diffraction gratings, as described above. For this reason, diffracted light beams of the 0th and ±1st orders appear in nine directions, as is shown in FIG. 5.

The laser beams may be reflected by the upper surface of first diffraction grating 15. Light beams reflected and diffracted by first diffraction grating 15, are reflected in a plane perpendicular to the bars of diffraction grating 15, and including the optical axis of incident light beam. More specifically, this reflected/diffracted light beams are reflected in a plane including the x axis and the z axis if the optical axis of incident light is given as the z axis in FIG. 4 or 5. In contrast to this, the diffracted light components of the 0th and ±1st orders appear in nine directions, as described above. According to the present invention, diffracted light beams of the 0th and 1st orders which do not propagate along the plane including the x and z axes, are detected. For this reason, the detected diffracted light beams will not interfere with reflected light beams. Therefore, the distance of the gap between the mask and the wafer can be accurately adjusted in accordane with the detected diffracted light beams.

In this invention, any of six diffracted light beans of (0,1)th, (0,−1)th, (1,1)th, (1,−1)th, (−1,1)th, and (−1,−1)th orders, are detected.

A case will be described wherein diffracted light beams of (0,1)th or (0,−1)th orders are detected. For the sake of simplicity, the principle diffraction, when laser beams are diffracted by diffraction gratings 15 and 16, will be described.

Figure 6:
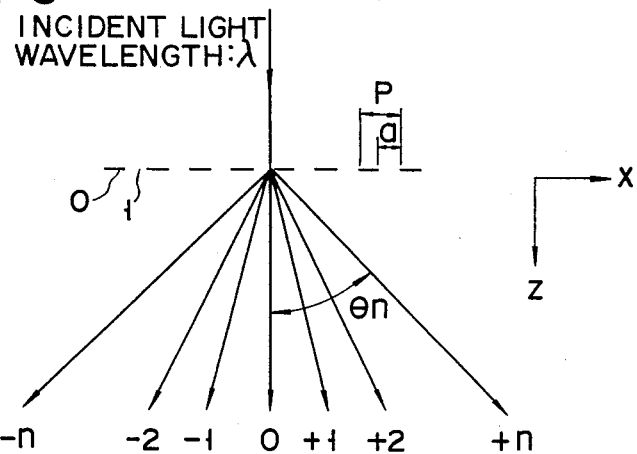
FIG. 6 is a view showing the principle of diffraction according to the present invention, and showing a pattern of light beams diffracted by a one-dimensional diffraction grating.

As is shown in FIG. 6, coherent light beam of wavelength λ is radiated onto a normal diffraction grating which has pitch p and light-transmission width a. FIG. 6 shows a diffraction pattern of the light beam diffracted by this diffraction grating. Diffraction angle $\theta_n$ of the diffracted light beam of the $+n$th order is expressed by:

$$\sin \theta_n = n \cdot \lambda / p \tag{1}$$

Complex amplitude Cn of the diffracted light beam of the nth order is a coefficient of the complex transmission function of diffraction grating, which the complex transmission function is expanded to a Fourier series, as periodic function. Complex amplitude $C_n$ of the diffracted light beam of the nth order is given by:

$$C_n = (1/p) \int_{-p/2}^{p/2} A(x)\{\exp -i(2\pi n/p)x\}dx \tag{2}$$

If complex transmission function A(x) of the grating, given as follows, is substituted for equation (2):

$$A(x) = \begin{array}{l} 0 \ (-p/2 \leqq x < -a/2) \\ 1 \ (-a/2 \leqq x < a/2) \\ 0 \ (a/2 \leqq x < p/2) \end{array} \tag{3}$$

complex amplitude $C_n$ of the diffracted light beam of the nth order is expressed by:

$$C_n = \{\sin (an\pi/p)\}/n\pi \tag{4}$$

Figure 7:
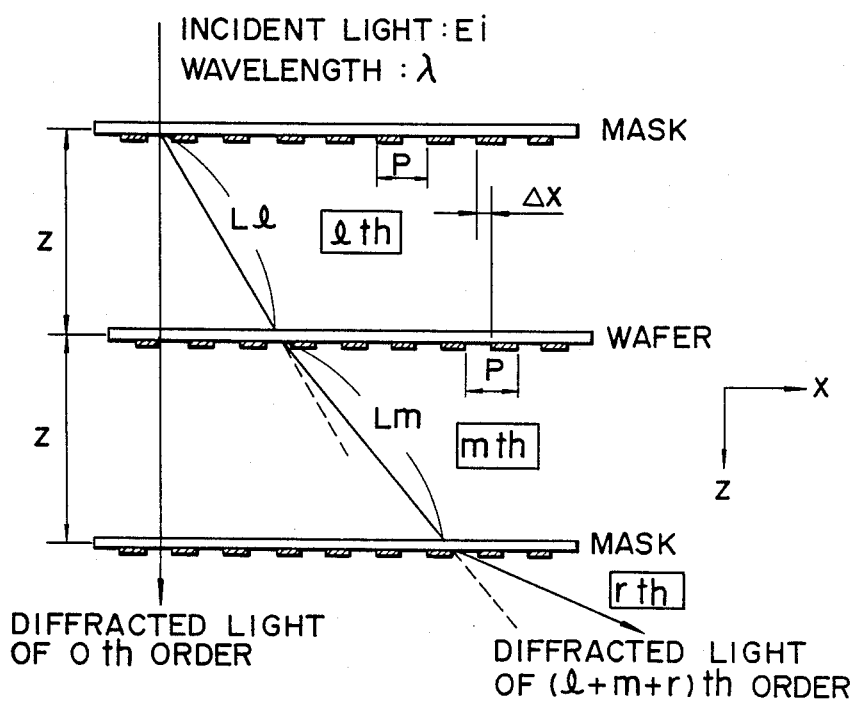
FIG. 7 shows the principle of diffraction according to the present invention, and illustrates an optical model equivalent to that when incident light beams are diffracted by the first diffraction grating of the mask, followed by the second diffraction grating of the wafer, and again by the first diffraction grating of the mask.

A case will now be explained wherein the slots of a mask and a wafer are oriented in the same direction. The optical model in this case is equivalent to an optical model shown in FIG. 7. When light beam is diffracted, by the mask, to be the lth order, by the wafer to be the mth order, and by the mask to be the rth order, the transmission light beam of mask wafer mask, becomes diffracted light beams of the (l+m+r)th orders. The amplitude of the diffracted light beam is given by $C_l \cdot C_m \cdot C_r$. The diffracted light beam is out of phase by $$\phi_x = \frac{2\pi}{\lambda} 2z - \left(\frac{2\pi}{\lambda}\right)\cdot\left(\frac{z}{2}\right)\left(\frac{l^2 + (l+m)^2}{p^2}\right)\lambda^2$$

relative to the incident light beam immediately before the incidence onto the mark.

When the wafer is displaced, with respect to the mask, by Δx, the amplitude of a light beam diffracted by the wafer is expressed using equation (2) as follows:

$$Cm' = (1/p)\int_{-p/2}^{p/2} A(x)\exp -i(2\pi m/p)(x + \Delta x)dx \tag{5}$$

Equation (5) can be rewritten as:

$$\begin{aligned} Cm' &= \exp\{-i(2\pi m/p)\Delta x\} \cdot \\ &\quad (1/p)\int_{-p/2}^{p/2} A(x)\exp -i(2\pi m/p)x \ dx \\ &= \exp\{-i(2\pi m/p)\Delta x\} \cdot Cm \end{aligned} \tag{6}$$

Transmission diffracted light beams U(l+m+r) of the (l+m+r)th orders are expressed, by following equation (7), as incident light beam Ein:

$$U(l + m + r) = C_l \cdot C_m' \cdot C_r \cdot \exp[-i\,\phi x]\, E_{in} \quad (7)$$
$$= C_l \cdot C_m \cdot C_r \cdot \exp[-i\{\phi x + (2\pi/p)m\Delta x\}]\, E_{in}$$

For example, diffracted light beams of the 0th order in the x direction are represented by a combination of all the diffracted light beams satisfying $l+m+r=0$.

A case will now be described wherein the slots of second diffraction grating 16 of the wafer are perpendicular to those of first diffraction grating of the mask, as is shown in FIG. 4. In this case, light beams are diffracted on a diffraction surface of the wafer perpendicular to that of the mask, as is shown in FIG. 5. If the order of diffraction in the x direction is the mth order, the order of diffraction in the y direction is the nth order, the pitch of a diffraction grating of the mask in the x direction is given as $p_x$, the pitch of a diffraction grating of the wafer in the y direction is given as $p_y$, the transmission width of light beam in the x direction of the diffraction grating of the mask is given as $a_x$, and the transmission width of the light beam in the y direction of the diffraction grating of the wafer is given as $a_y$, the amplitude of the light beam diffracted by the wafer is given by the following equation:

$$C_{mn} = \left(\sin \frac{a_y}{p_y} n\pi\right)/n\pi \quad (8)$$

In equation (8), if $a_y/p_y = \frac{1}{2}$, $C_{mn}$ is:

$$C_{mn} = \left(\sin \frac{1}{2} n\pi\right)/n\pi \quad (9)$$

Therefore, light beam $U(l+m+r, n)$ diffracted via mask→wafer→mask is expressed by:

$$U(l + m + r, n) = \quad (10)$$
$$C_r \cdot C_{mn} \cdot C_l \cdot \exp[-i\{\phi xy + (2\pi/p)m\Delta x\}]\, E_{in}$$

In the equation (10), $\phi xy$ is a dephasing amount relative to the incident light beam immediately before the incidence onto the mask, and is given as follows:

$$\phi xy = \left(\frac{2\pi}{\lambda}\right)\left[2z - \frac{z}{2}\left(2\frac{l^2}{p_x^2}\cdot\lambda^2 + \frac{n^2}{p_y^2}\cdot\lambda^2\right)\right]$$

As an example of this diffracted light beam, intensity $I(0,1)$ of the 0th order in the x direction and of the 1st order in the y direction can be obtained as follows: In this case, a combination yielding $l+m+r=0$ can be taken into consideration. However, the influence of a combination of diffracted light beams of higher orders on amplitude, is small. Therefore, a combination of diffracted light beams of the 0th to 3rd orders is taken into consideration. The following five combinations can be considered using $l,(m,n),r$:

{0,(0,1),0}
{1,(0,1),−1}
{−1,(0,1),1}
{3,(0,1),−3}
{−3,(0,1),3}

If $Z = \pi\lambda z/p^2$, from equation (10) the equation of the light beam can be rewritten as:

$$U(0,1) = (1/\pi)[(1/4) + 2(1/\pi)^2 \cdot \{\exp(-i2Z) + \quad (11)$$
$$(1/9)\cdot\exp(-i18Z)\}]E_{in}$$

Intensity $I(0, 1)$ of light beam is:

$$I(0,1) = |U(0,1)|^2 \quad (12)$$

For this reason, when the intensity of incident light beam is $I_0$, light beam intensity $I(0,1)$ is:

$$I(0,1) = (1/\pi)^2 \cdot \{(1/4)^2 + (1/\pi)^2 \cos 2Z + \quad (13)$$
$$(1/9)(1/\pi)^2 \cdot \cos 18Z + 4(1/\pi)^4 +$$
$$(8/9)(1/\pi)^4 \cdot \cos 16Z + (2/9)^2(1/\pi)^4\} \cdot I_0$$

As can be seen from this equation, intensity $I(0,1)$ of diffracted light beam is a function of only a gap z between the mask and the wafer, and is not associated with shift $\Delta x$ in position in the x direction therebetween. It is because that, since m (the order of diffraction of wafer grating in the x direction) in equation (10) is zero, the term $\Delta x$ is not included in equation (13).

Figure 8A:
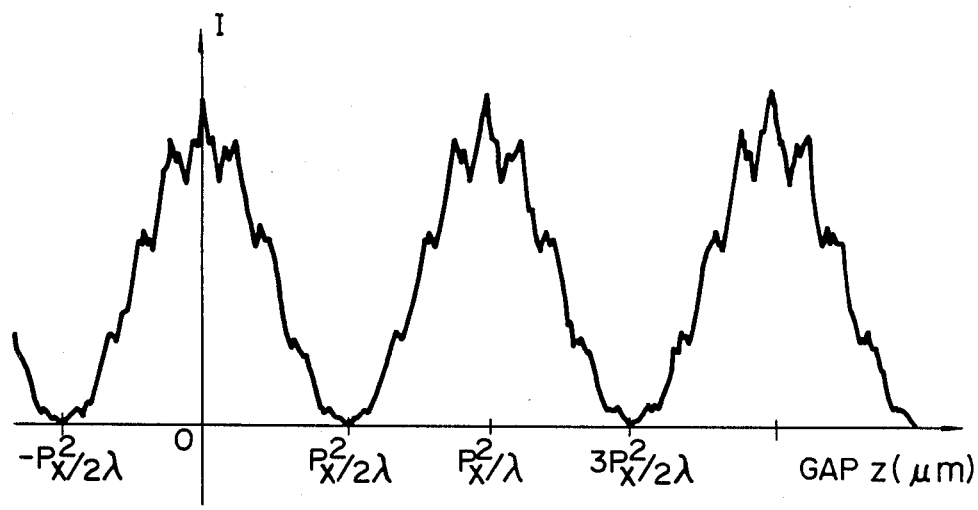
FIGS. 8A and 8B are graphs showing the relationship between the intensity of diffracted light beams and the size of the gap between the mask and the wafer, the diffracted light beams being detected by the apparatus based on the first embodiment of the present invention.

FIG. 8A shows the relationship between the light beam intensity and the size of the gap between the mask and the wafer. As can be seen from FIG. 8A, the periodic function includes high-frequency components.

For the sake of comparison, a case will be described, wherein the order of respective gratings of mask and wafer, are restricted within a range on the order of ±1st order. In this case, the following three combinations can be considered.

[1,(0,1),−1], [−1,(0,1),1], [(0,(0,1),0]

From equation (10), equation of light beam is:

$$U[0,1] = (1/\pi)^3 \cdot e^{-i2Z} + (1/\pi)^3 \cdot e^{-i2Z} + (1/2)^2 \cdot (1/\pi) \quad (14)$$
$$= 2(1/\pi)^3 e^{-i2Z} + (1/2)^2(1/\pi)$$

The light beam intensity is expressed by:

$$I(0,1) = |U(0,1)|^2 \quad (15)$$
$$= 4(1/\pi)^6 + (1/2)^4 \cdot (1/\pi)^2 + (1/\pi)^4 \cos 2Z$$

A case will now be described wherein diffracted light beams of (1,1)th, (1,−1)th, (−1,1)th, and (−1,−1)th orders are detected. For example, when diffracted light of (1,1)th order is detected, two combinations, i.e., [1,(0,1),0] and [0,(0,1),1], of diffracted light beams detected via mask→wafer→mask need be considered. Although combinations of [2,(0,1),−1], (−1,(0,1),2], . . . , [8,(0,1)−7], [−7,(0,1),8], . . . can be considered, if $a/p=\frac{1}{2}$, the amplitude of diffracted light beam on the mask is:

$$C_n = \sin(n\pi/2)n\pi$$

For this reason, for orders of even numbers, i.e., n=2, 4, 6, 8, . . . , $C_n$ becomes zero.

Therefore, based on equation (10), equation of light beam of (1,1) is expressed as:

$$U[1,1] = (1/2) \cdot (1/\pi) \cdot (1/\pi) \cdot e^{-iZ} \cdot e^{-ix} + \qquad (16)$$
$$(1/\pi) \cdot (1/\pi) \cdot (1/2) \cdot e^{-ix}$$
$$= (1/2)(1/\pi)^2 \cdot e^{-ix} \{1 + e^{-iZ}\}$$

where $X = 2\pi/p_x \cdot \Delta x$, $Z = \pi\lambda/p_x^2 \cdot z$, $p_x$ is a pitch of the grating of the mask, $\Delta x$ is a shift in position, z is a gap, and $\lambda$ is a laser beam wavelength.

The light intensity is expressed as:

$$I(1,1) = |U[1,1]|^2 \qquad (17)$$
$$= (1/2)(1/\pi)^4 \cdot (1 + \cos 2Z)$$

Figure 8B:
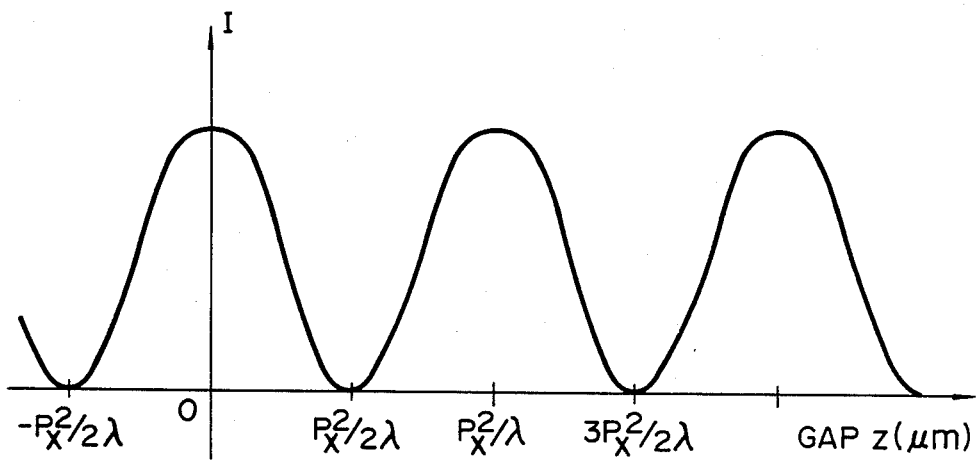

FIG. 8B shows the relationship between the light beam intensity and the size of a gap between the mask and the wafer, in this case. In this case, the periodic function does not include high-frequency components. Therefore, to adjust the size of the gap between the mask and the wafer, diffracted light beam of (1,1)th orders is preferably detected rather than diffracted light beam of (0,1)th orders.

In this manner, according to the setting method of the present invention, diffracted light beam, which does not propagate along a plane perpendicular to the bars of the diffraction grating of the mask and including the optical axis of incident light beam, is detected. The detected diffracted light beams will not interfere with reflected/diffracted light beams which are reflected on the grating of the mask. In addition, as can be seen from equation (13), diffracted light beam depends only on gap z, and is not influenced by the position in the x direction. For this reason, upon setting of the gap, the position in the x direction need not be strictly controlled. When diffracted light beams of $(+1, \pm 1)$th orders are detected, a detection signal includes no high-frequency components. In this case, the gap can be more accurately set to be a predetermined value, than in a case wherein diffracted light beams of $(0, \pm 1)$th orders are detected.

Figure 9:
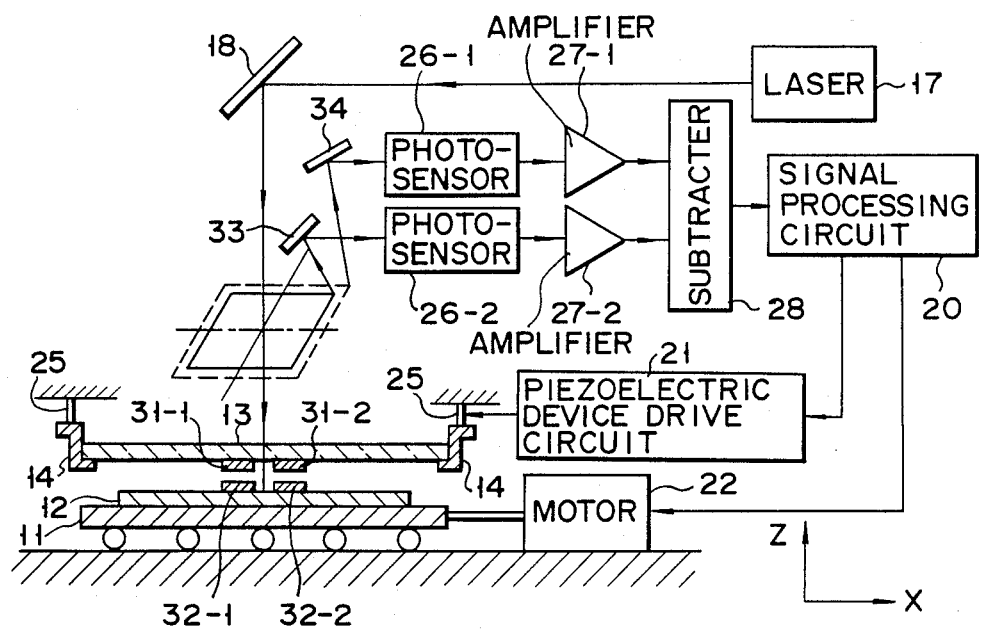
FIG. 9 is a view schematically illustrating an apparatus for setting a gap between a mask and a wafer to a predetermined distance, according to a second embodiment of the present invention.
Figure 10:
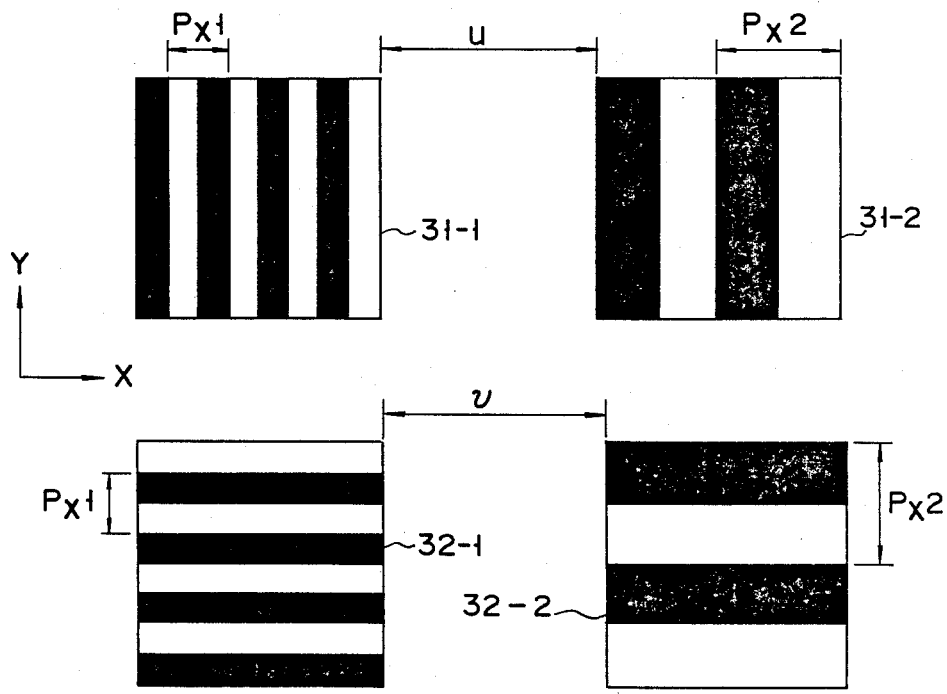
FIG. 10 is a plan view showing diffraction gratings respectively formed on the mask and the wafer, in the apparatus shown in FIG. 9.

A second embodiment of the present invention will now be described, with reference to FIGS. 9 to 11.

In this embodiment, two sets of first and second diffraction gratings are arranged. More specifically, two first diffraction gratings 31-1 and 31-2 are formed on mask 13, and two second diffraction gratings 32-1 and 32-2 are formed on wafer 12. As is shown in FIG. 10, first diffraction gratings 31-1 and 31-2 are one-dimensional diffraction gratings having grating pitches $p_{x1}$ and $p_{x2}$ in the x direction. First diffraction gratings 31-1 and 31-2 are arranged to be separated at distance u from each other. Second diffraction gratings 31-1 and 32-2 are one-dimensional diffraction gratings, and have grating pitches $p_{y1}$ and $p_{y2}$ in the y direction, respectively. Second diffraction gratings 32-1 and 32-2 are arranged to be separated at distance v from each other.

Two first diffraction gratings 31-1 and 31-2 of the mask have different grating pitches. Two second diffraction gratings 32-1 and 32-2 of the wafer also have different grating pitches. For this reason, light beams diffracted by one set of first and second diffraction gratings 31-1 and 32-1 and light beams diffracted by the other set of first and second diffraction gratings 31-2 and 32-2, separately appear.

For this purpose, a pair of photosensors 26-1 and 26-2 for independently detecting two diffracted light beams and subtracter 28 are arranged in an alignment apparatus of this embodiment. Two diffracted light beams are independently converted to electrical signals by photosensors 26-1 and 26-2. These electrical signals are supplied to subtracter 28 through amplifiers 27-1 and 27-2, respectively. Subtracter 28 calculates the difference between the intensities of the two diffracted light beams, i.e., two electrical signals. The difference in the two electrical signals is supplied to signal processing circuit 20. In the same manner as in the first embodiment, a piezo-electric device drive signal is produced from signal processing circuit 20, and a current is supplied to piezo-electric device 25, based on this signal. Then, the distance of the gap between the mask and the wafer is adjusted.

In the case of diffracted light beam of (1,1)th orders, if the intensities of two diffracted light beams are given by $I_1(1,1)$ and $I_2(1,1)$, subtracter 28 calculates the following equation:

$$\Delta I = I_1(1,1) - I_2(1,1)$$

FIG. 11B shows the relationship between the light beam intensity and the distance of the gap between the mask and the wafer, in this case. The periodic function does not include high-frequency component. A set value can be zero-point detected on a linear portion of the periodic function. Therefore, adjustment of the distance of the gap can be facilitated. Note that u and v can be appropriately determined. As can be seen from equation (17), the intensity of diffracted light beams does not depend on the positions of first and second diffraction gratings in the x direction.

FIG. 11A shows a change in light intensity with respect to the gap between the mask and the wafer, in the case of diffracted light beam of (0,1)th orders. In this case, the periodic function includes high-frequency components. However, the high-frequency components do not interfere with zero-point detection.

In this embodiment, the diffraction light beam to be detected can be not only I(0,1) but also I(0,−1). In other words, diffracted light beam to be detected may be one that does not propagate along a plane perpendicular to the slots of the first diffraction grating and including the optical axis of incident light beam. For example, $\Delta I$ may be follows:

$$\Delta I = I_1(0,-1) - I_2(0,-1)$$

$$\Delta I = I_1(0,1) - I_2(0,-1)$$

$$\Delta I = I_1(0,-1) - I_2(0,1)$$

Figure 12:
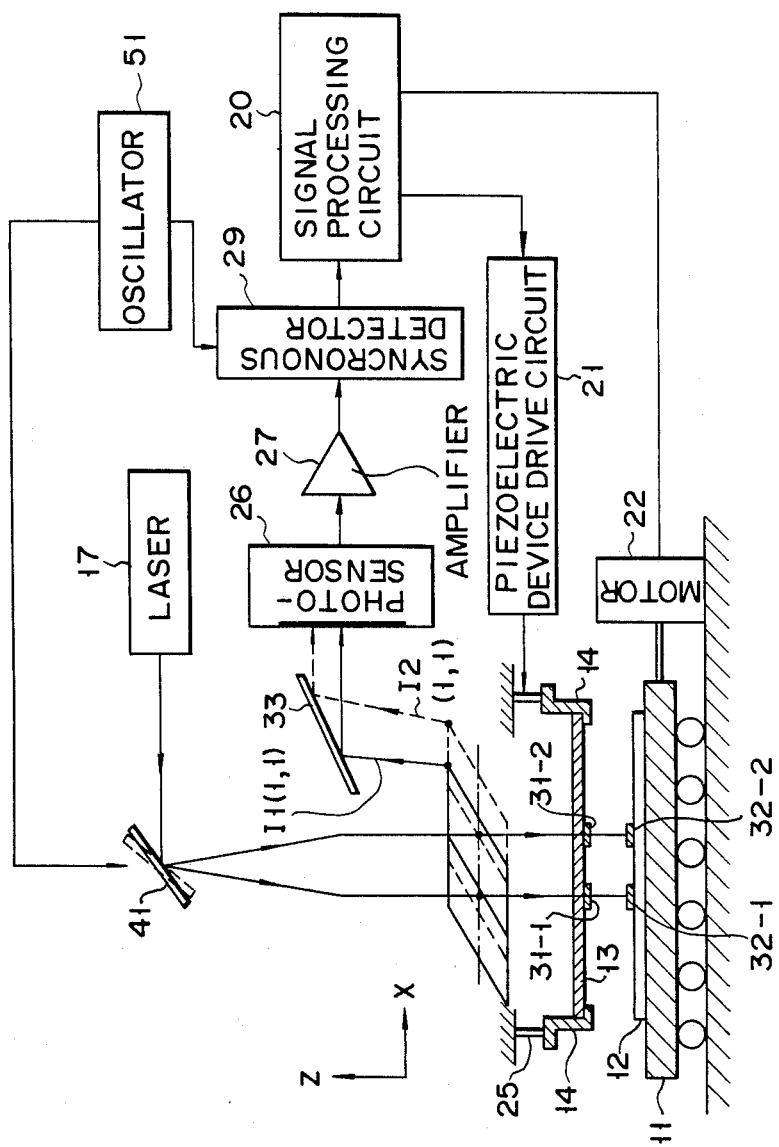
FIG. 12 is a view schematically illustrating an apparatus for setting a gap between a mask and a wafer to a predetermined distance, according to a modification of the second embodiment of the present invention.

A modification of the second embodiment will now be described below. As is shown in FIG. 12, two light beams diffracted by two sets of first and second diffraction gratings are synchronously detected in order to calculate a difference in the intensities thereof. The two first diffraction gratings of the mask have different pitches, while the two second diffraction gratings of the wafer can have the same or different pitches. First diffraction gratings 31-1 and 31-2 are arranged on a mask, to be separated by u, similarly to the case shown in FIG. 10. The second diffraction gratings are arranged on the wafer, to be separated by v, similarly to the case shown in FIG. 10.

Oscillator 51, oscillation mirror 41, and synchronous detector 29 are arranged on the setting apparatus, in order to synchronously detect two diffracted light beams. Oscillator 51 generates a reference signal of a predetermined frequency, which is supplied to oscillation mirror 41 and synchronous detector 29, respectively. Oscillation mirror 41 is thus oscillated at the predetermined frequency. Laser beam is alternately guided in two directions, every predetermined period of time, and is incident on two sets of diffraction gratings. Two light beams diffracted by two sets of diffraction gratings are alternately incident on photosensor 26, via mirror 33 and are converted to two electrical signals. The two electrical signals are alternately supplied, via amplifier 27, to synchronous detector 29, every predetermined period of time. Synchronous detector 29 synchronously detects the two electrical signals, based on the reference signal, at the predetermined frequency. Thus, the intensities of the two diffracted light beams can be detected, respectively, and the difference between intensities of two diffracted light beams is calculated. Of course, the diffracted light beams to be detected can be diffracted light beams of $(0, \pm1)$th orders or $(\pm1, \pm1)$th orders.

A third embodiment of the present invention will now be described. In the first and second embodiments, one-dimensional diffraction gratings are respectively formed on a mask and a wafer. In the third embodiment, a one-dimensional diffraction grating is formed on a mask, and a two-dimensional diffraction grating is formed on a wafer and has cross-bars.

Figure 13:
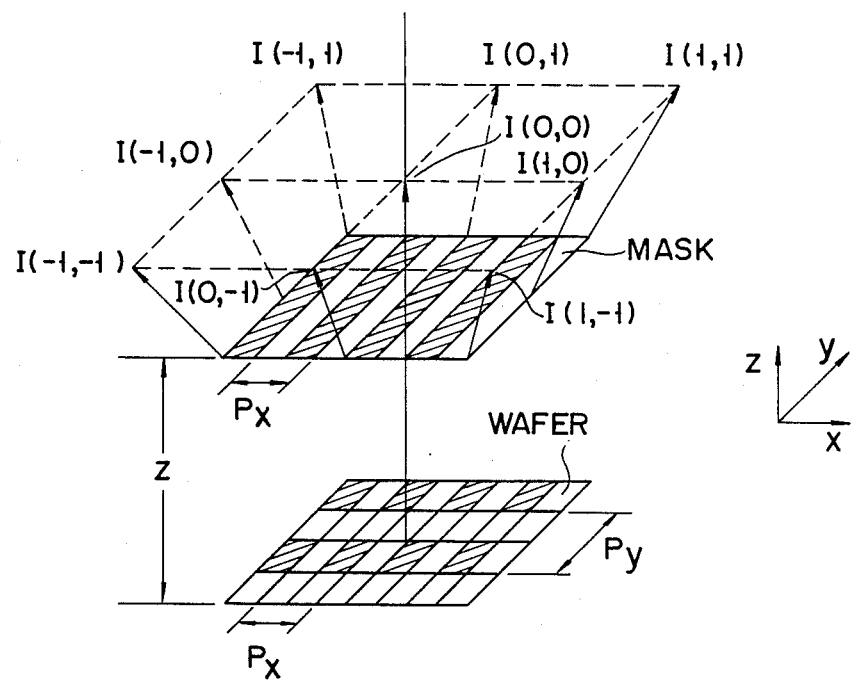
FIG. 13 is a perspective view showing a pattern of light beams diffracted by the diffraction gratings of the mask and the wafer, in the third embodiment of the present invention.

In this case, when light beams are diffracted in the order of first diffraction grating, second diffraction grating, and first diffraction grating, the first and second diffraction gratings serve as double diffraction gratings. For this reason, diffracted light beams of 0th and $\pm 1$st orders appear in nine directions, as shown in FIG. 13. Reflected light beams are reflected by the first diffraction grating, in a plane including the x and z axes. In this case, the diffracted light beams of 0th and $\pm 1$st orders which do not propagate along a plane including the x and z axes, can be detected.

When diffracted light components of $(0, \pm 1)$th orders are detected, the intensity of diffracted light is calculated as follows:

In equation (10), $\phi xy$ is expressed as:

$$\phi xy = \frac{2\pi}{\lambda}\left[2z - \frac{z}{2}\left(\frac{l^2 + (l+m)^2}{P_x{}^2} \cdot \lambda^2 + \frac{n^2}{P_y{}^2} \cdot \lambda^2\right)\right]$$

In this equation, if diffracted light beams of higher orders (e.g., 2nd order or higher) is ignored, the following seven combinations need be taken into consideration for $\{l, (m,n), r\}$:

$\{-1, (1,1), 0\}$
$\{1, (-1,1), 0\}$
$\{-1, (0,1), 1\}$
$\{0, (-1,1), 1\}$
$\{0, (0,1), 0\}$
$\{0, (1,1), -1\}$
$\{1, (0,1), -1\}$

In this case, intensity $I(0,1)$ of diffracted light beam is given as:

$$I(0,1) = (1/\pi)^2 \cdot [(1/2)^6 + (1/\pi)^4 + (1/2)^2(1/\pi)^2 \cdot \cos 2Z + \quad (18)$$
$$4(1/\pi)^4 \cos^2 X + 4(1/\pi)^2 \cdot \{(1/2)^3 + (1/\pi)^2\}\cos X \cdot \cos Z] I_0$$

where $X = (2\pi/p_x)\Delta x$. Therefore, in this case, the size of the gap is adjusted so that $\Delta x$ is maintained so as not to yield $\cos X = 0$.

Figure 14:
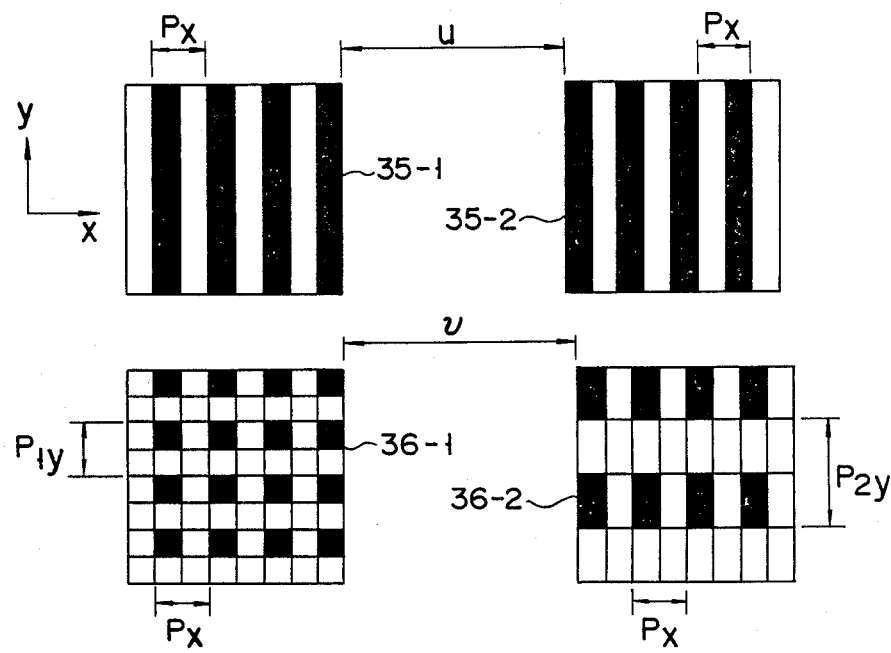
FIG. 14 is a plan view showing a diffraction grating for setting a gap between a mask and a wafer to a predetermined distance, according to a third embodiment of the present invention.

As is shown in FIG. 14, in this embodiment, two sets of first and second diffraction gratings may be arranged.

More specifically, two first diffraction gratings 35-1 and 35-2 are formed on mask 13, and two second diffraction gratings 36-1 and 36-2 are formed on wafer 12. As shown in FIG. 14, first diffraction gratings 35-1 and 35-2 are one-dimensional diffraction gratings having grating pitch $p_x$ in the x direction. First diffraction gratings 35-1 and 35-2 are arranged to be separated by distance u from each other in the x direction. Second diffraction grating 36-1 is a two-dimensional diffraction grating having grating pitch $p_x$ in the x direction and grating pitch $p_{1y}$ in the y direction. Second diffraction grating 36-2 is a two-dimensional diffraction grating having grating pitch $p_x$ in the x direction and grating pitch $p_{2y}$ in the y direction. Second diffraction gratings 36-1 and 36-2 are arranged to be separated by distance v ($=u+p_x/2$) in the x direction.

In the third embodiment, the difference between the intensities of two diffracted light beams is detected, so as to adjust the distance of the gap, in the same manner as in the second embodiment. For this purpose, the distance of the gap is adjusted using the same apparatus as shown in FIG. 9. The description of the apparatus will therefore be omitted. When diffracted light beams of $(0,1)$th orders are detected, difference $\Delta I$ between intensities is:

$$\Delta I = I_1(0,1) - I_2(0,1)$$

Figure 15:
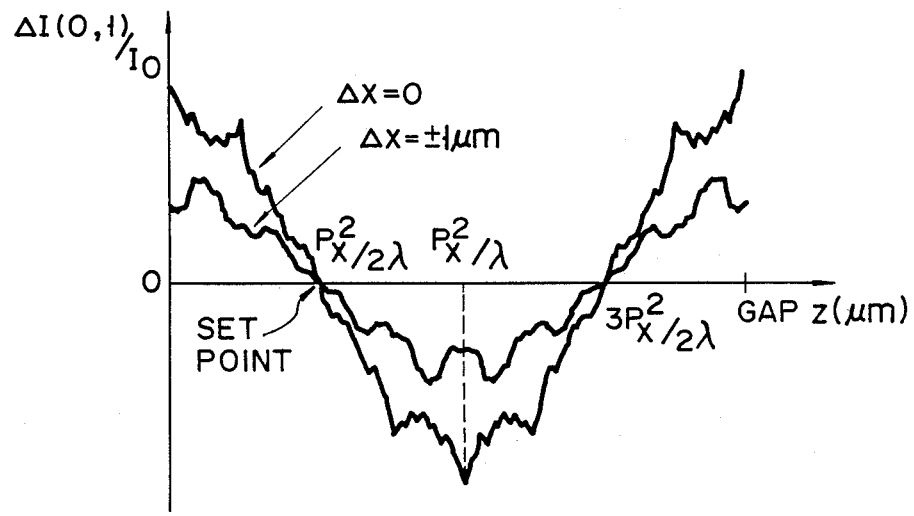
FIG. 15 is a graph showing the relationship between a difference in the intensities of diffracted light beams and a distance of a gap between the mask and the wafer, the diffracted light beams being detected by the method according to the third embodiment of the present invention.

FIG. 15 shows the relationship between the difference of each intensity of diffracted light beams and the distance of the gap in this case. The periodic function shown in the graph is obtained while taking diffracted light beams of higher orders (e.g., $\pm 2$nd order or higher) into consideration. For this reason, the periodic function includes high-frequency components.

In this embodiment, a difference between u and v is $p_x/2$. The phase of diffracted light beam obtained by diffraction gratings 35-1 and 36-1 is shifted from that of diffracted light beam obtained by diffraction gratings 35-2 and 36-2 by $\pi$ in the x direction. If shift $\Delta x$ in position in the x direction can be maintained to be a predetermined value, the difference between two diffracted light beams is detected so as to zero-point detect a set value on the linear portion of the periodic function.

In the third embodiment, the distance of the gap can be adjusted by the synchronous detection method shown in FIG. 12. In this case, the two diffraction gratings of the wafer can have the same or different pitches in the y direction. If laser beam is radiated, obliquely in the y direction, detection optical system (e.g. mirror) does not interfere with exposure light for exposing a circuit pattern.

Figure 17A:
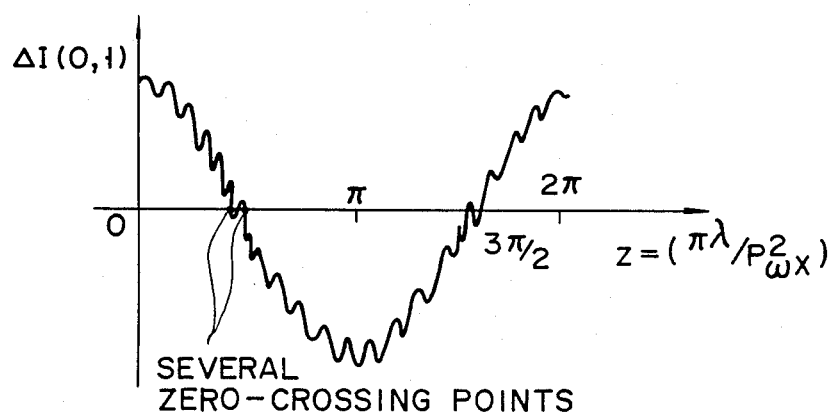
FIGS. 17A and 17B are graphs showing the relationship between a difference in the intensities of diffracted light beams and a distance of a gap between the mask and the wafer, the diffracted light beams being detected by the method according to the modification of the third embodiment of the present invention.

A modification of the third embodiment will now be described. In the above embodiments, when laser beam is incident on the mask, light beams which are multireflected between the mask and the wafer, may often interfere with diffracted and detected light beams. The detection signal of diffracted light often includes ripple components. As is shown in FIG. 17A, if the detection signal includes the ripple components having a period $\lambda/2$, several zero-crossing points appear near the set value of the gap. For this reason, when the distance of the gap is adjusted, the precision of adjustment may be degraded.

Figure 16:
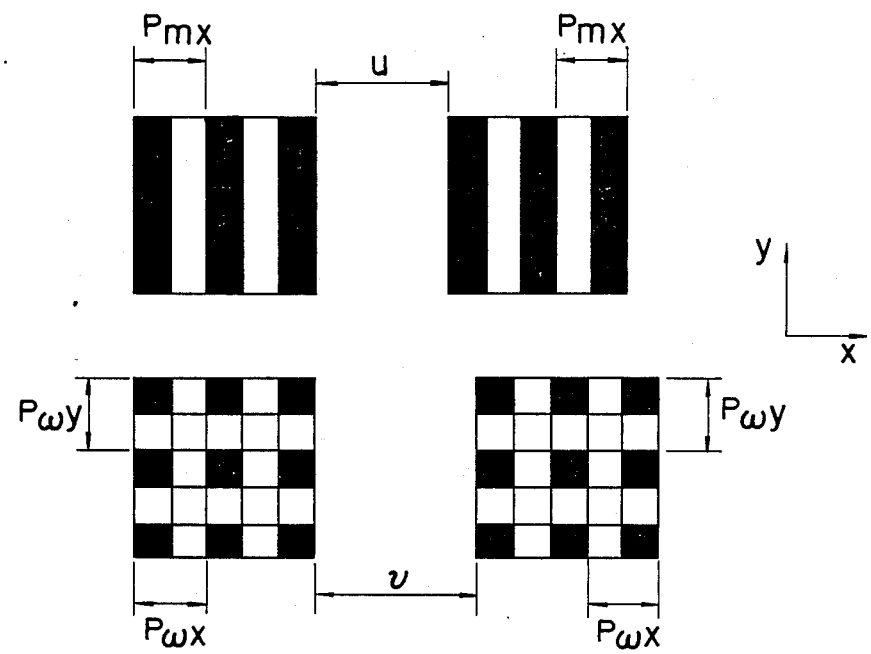
FIG. 16 is a plan view showing a diffraction grating for setting of a gap between a mask and a wafer to a predetermined distance according to the modification of the third embodiment of the present invention.

In this modification, as is known in FIG. 16, if the two-dimensional diffraction grating of the wafer has grating pitch $p_{wx}$ in the x direction and grating pitch $p_{wy}$ in the y direction, $p_{wx}=p_{wy}$ or $p_{wx}\approx p_{wy}$. Also, if the one-dimensional diffraction grating of mask has grating pitch $P_{mx}$ in the x direction, $P_{mx}=P_{wx}$. More specifically, the two-dimensional diffraction grating is constituted by a combination of square patterns.

Figure 17B:
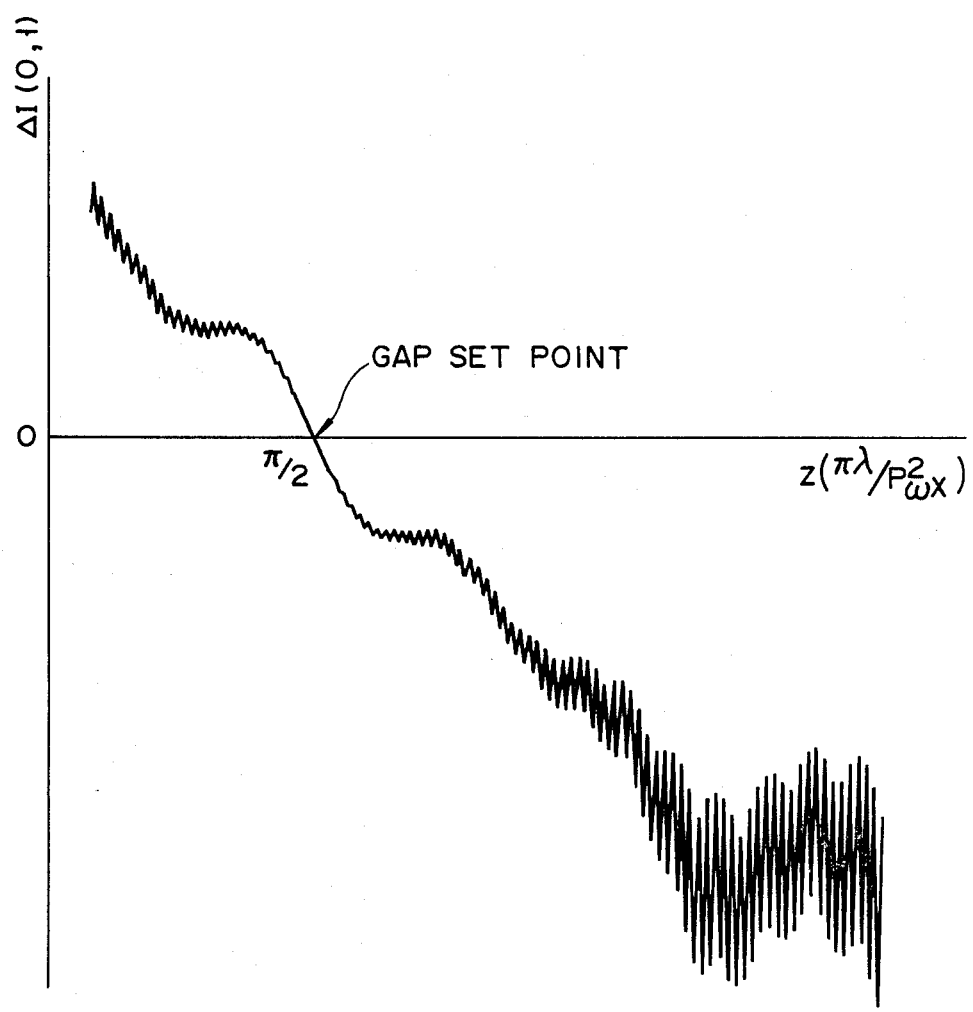

In this modification, the intensity of diffracted light beam, when diffracted light beam of (0,1)th orders is detected, is expressed by equation (18). FIG. 17B shows the detection result when the difference between intensities of diffracted light beam is detected. As is apparent from the detection result, only one zero-crossing point appears. For this reason, since the set value is zero-point detected on the linear portion of the periodic function, the precision of adjustment of the size of the gap can be improved. This modification has a noticeable effect in terms of not only elimination of the influence of reflected light beams by the first diffraction grating but also that of ripple components.

Figure 18:
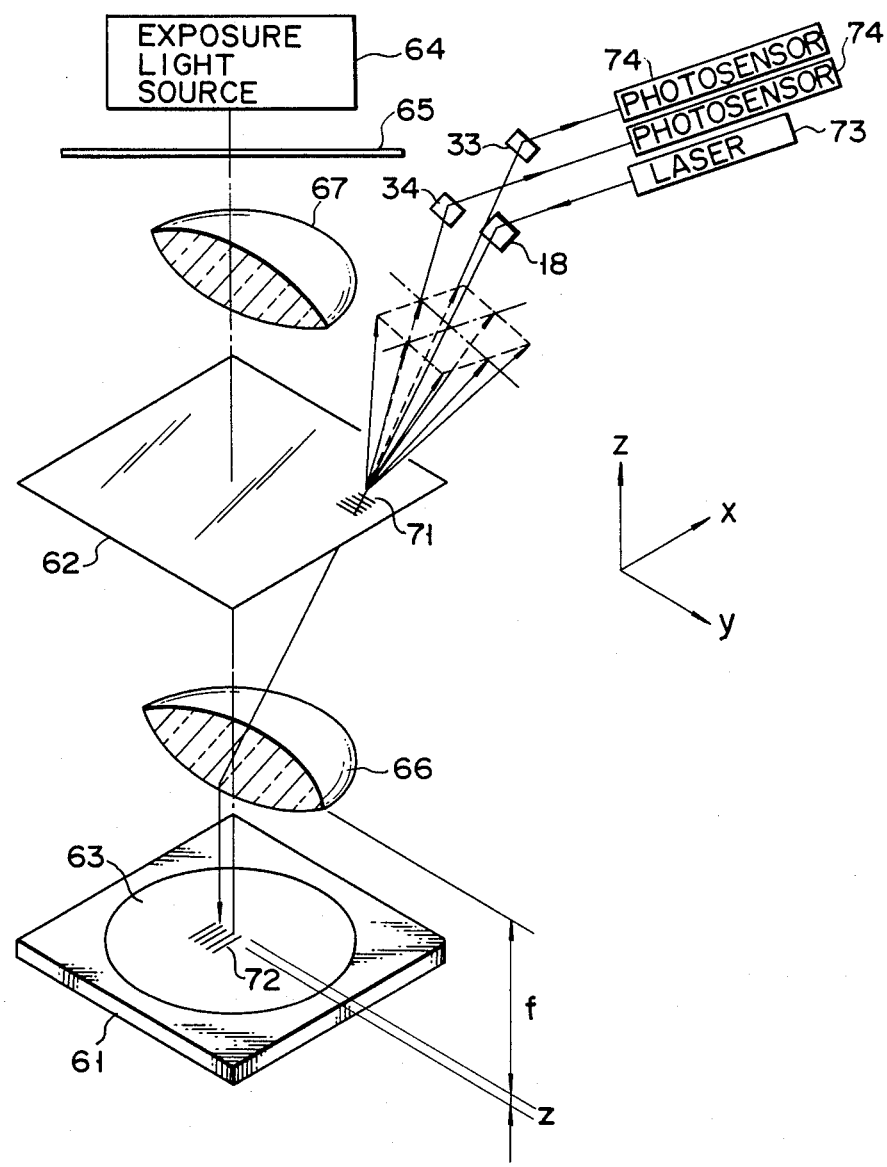
FIG. 18 is a perspective view schematically illustrating a projection exposure apparatus to which the present invention is applied, according to a fourth embodiment of the present invention.

A fourth embodiment of the present invention will now be described. This embodiment is applied to a reduction projection exposure apparatus. In this exposure apparatus, an image of a circuit pattern preformed on a mask is reduced and transferred to a wafer. As shown in FIG. 18, this apparatus has wafer table 61 which is movable in the z direction. Wafer 63 is placed on wafer table 61. Mask 62 is arranged above wafer 63. This apparatus also has exposure light beam source 64, and shutter 65 capable of shielding light emitted from light source 64. Projection lens 66 is arranged between mask 62 and wafer 63. Condenser lens 67 is arranged between mask 62 and shutter 65. When shutter 65 is opened and light beam from exposure light source 64 is radiated, an image of a circuit pattern is transferred to wafer 63.

In this exposure apparatus, wafer 63 must be located on the in-focus position of projection lens 66. More specifically, defocusing amount z of wafer 63 must be adjusted to be zero with respect to focal length f of projection lens 66. In the conventional apparatus, light beam is radiated on a reflection surface formed on a wafer, so as to perform focusing. However, since the reflectance of the reflection surface of wafer, is nonuniform, focusing errors may occur.

In this embodiment, transmission type first diffraction grating 71 is formed on mask 62, as in the first embodiment. Reflection type second diffraction grating 72 is formed on wafer 63. First diffraction grating 71 is a one-dimensional diffraction grating, the stripes (bars) of which extend in the y direction. Second diffraction grating 72 is a one-dimensional diffraction grating, the stripes (bars) of which extend in the x direction (aligning direction). The stripes (bars) of these diffraction gratings are perpendicular to each other.

In this apparatus, wafer 63 is located on the in-focus position of projection lens 66, as follows. Light beam emitted from laser 73 is incident on first diffraction grating 71 of the mask. Diffracted light beams passing through first diffraction grating 71 are radiated on second diffraction grating 72 through projection lens 66. Light beams diffracted and reflected by second diffraction grating 72 are again radiated on first diffraction grating 71 of the mask through projection lens 66. Light beams transmitted and diffracted by first diffraction grating 71 is detected by beams are converted to an electrical signal and is processed in the same manner as in the first embodiment.

The slots of first and second diffraction gratings 71 and 72 are perpendicular to each other, as is described above. For this reason, as is described in the first embodiment, light of $(0,\pm 1)$th and $(\pm 1,-1)$th orders are detected.

Figure 19:
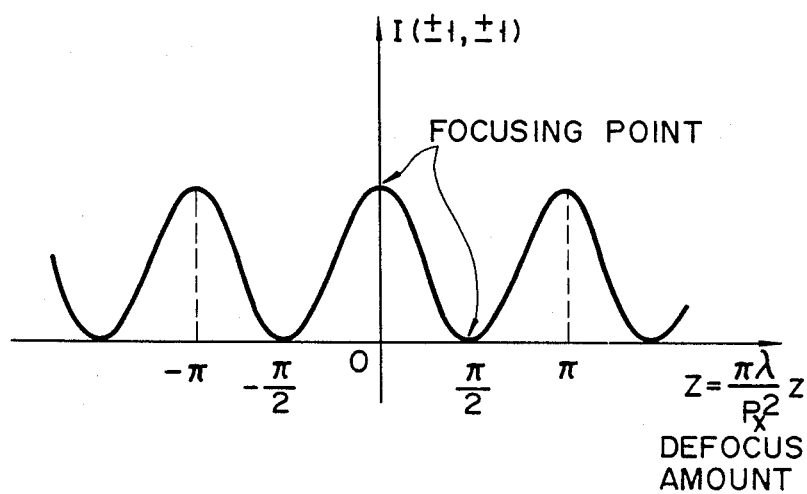
FIGS. 19 and 20 are graphs showing the relationship between a difference in the intensities of diffracted light beams and defocusing amount, the diffracted light beams detected by the method according to the fourth embodiment of the present invention.

When light beams of $(\pm 1,\pm 1)$th orders are detected, the intensity of light beams is expressed by equation (17). As can be seen from equation (17), the light intensity is independent of a shift in position between the mask and the wafer in the x direction. For this reason, wafer 63 can be adjusted to be located on the in-focus position of projection lens 66, irrespective of a shift in position between the mask and the wafer in the x direction. Even if the surface of the wafer has nonuniform reflectivity, the position of wafer 63 can be accurately adjusted. FIG. 19 shows the relationship between the light beam intensity and defocusing amount z. In the same manner as in the first embodiment, a peak value of the periodic function is detected, and the focal point is adjusted. For this reason, the focusing operation can be facilitated.

Figure 20:
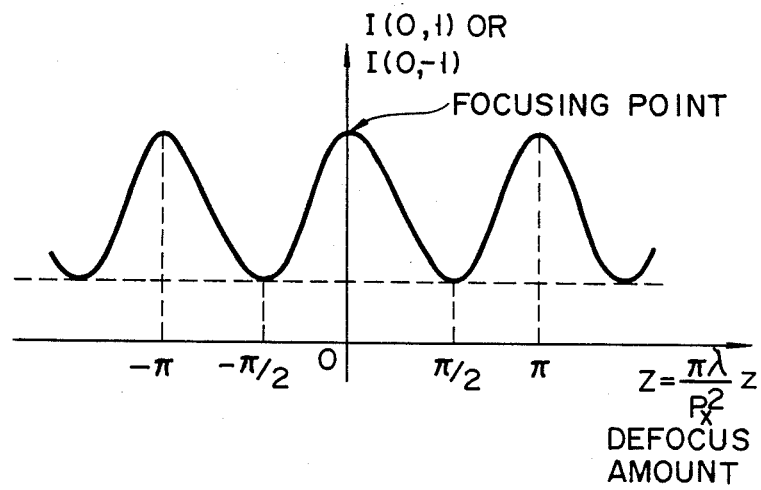

When light beams of $(0,\pm 1)$th orders are detected, the intensity of light beams is expressed by equation (13). In this case, wafer 63 can be adjusted to be located on the in-focus position of projection lens 66, irrespective of a shift in position between the mask and the wafer in the x direction. FIG. 20 shows the relationship between the light beam intensity and defocusing amount z.

Figure 21:
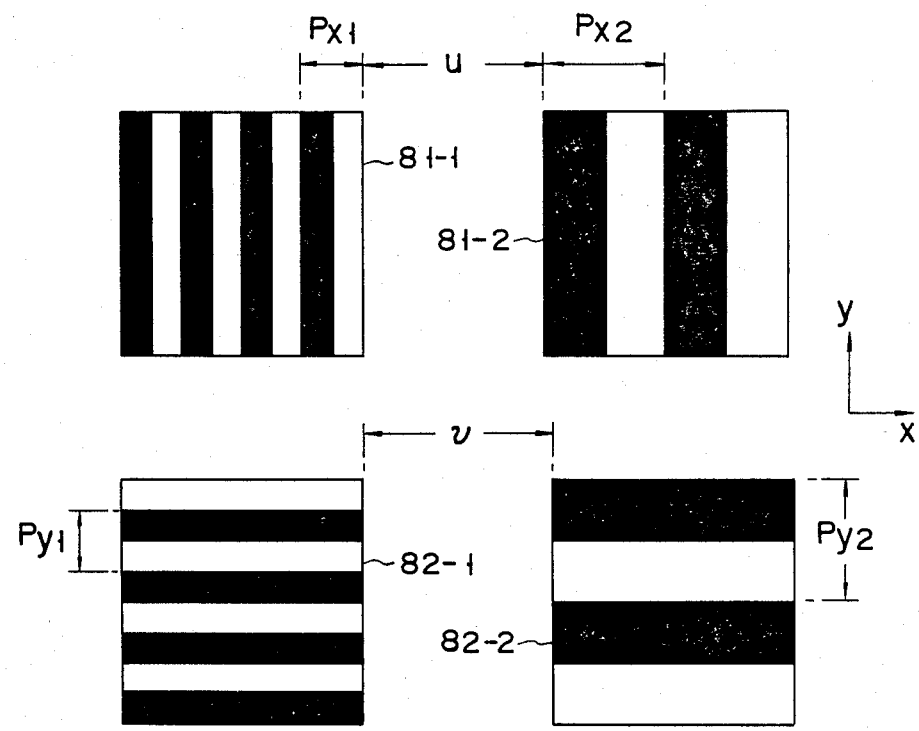
FIG. 21 is a plan view of a diffraction grating used in the method according to the modification of the fourth embodiment of the present invention.
Figure 22:
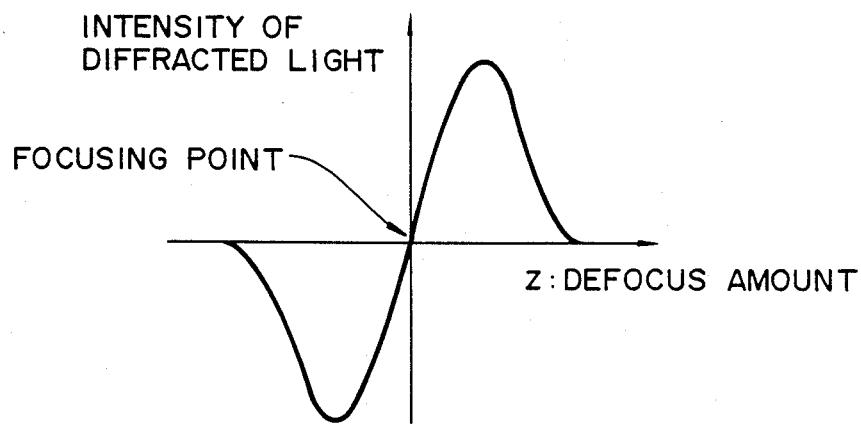
FIG. 22 is a graph showing the relationship between a difference in the intensities of diffracted light beams and defocusing amounts, which is detected by the method according to the modification of the fourth embodiment of the present invention.

In the fourth embodiment, two sets of diffraction gratings are used for the mask and the wafer, respectively. More specifically, as is shown in FIG. 21, one-dimensional diffraction gratings are arranged perpendicular to each other. If $p_{yl}=p_{y2}$, a difference between two diffracted light beams intensity can be detected by a method shown in FIG. 9. As is shown in FIG. 22, the focal point is obtained at a position of difference signal "0". The difference between two diffracted light beams intensity can also be detected by the synchronous detection method shown in FIG. 12. In this case, the same function as the periodic function shown in FIG. 22 can be obtained. In this case, grating pitches can be $p_{y1}\neq p_{y2}$ or $p_{y1}=p_{y2}$.

A fifth embodiment of the present invention will now be described. In the above-mentioned four embodiments, the incident light beam is perpendicular to mask 13. However, the incident light beam need not always be perpendicular to mask 13. In the fifth embodiment, a case will be discribed wherein a light beam is obliquely incident on mask 13.

As shown in FIG. 23, first diffraction grating 15 formed on mask 13 and second diffraction grating 16 formed on wafer 12 are arranged in the same manner as in the case shown in FIG. 5. As shwon in FIG. 23, a plane perpendicular to the bars direction of first diffraction grating 15 is defined as first plane 101. A plane obtained by incliniong first plane 101 in the bars direction at a predetermined angle ($\alpha$°) is defined as second plane 102. A plane symmetrical to the second plane with respect to first plaen 101 is defined as third plane 103. Light beam emitted from laser 17 is incident on first diffraction grating 15. Optical axis (104) of the incident light beam is present on the second plane 102. A smaller number of incident light beam 104 is reflected and diffracted by the surface of grating 15. The reflected and diffracted light beams are transferred along only third plane 103.

Most of incident light beam 104 is diffracted by and transmitted through first diffraction grating 15, and are transferred to second diffraction grating 16. The light beams diffracted and reflected by second diffraction grating 16, are transferred to first diffraction grating 15. The light beams are diffracted by and transmitted through first diffraction grating 15. The diffracted light beam which is diffracted along a path of first diffraction grating second diffraction grating first diffraction grating, appears as a two-dimensional pattern. The diffraction pattern is the same manner as in the case wherein the light beam is incident perpendicularly on grating 15.

As is shown in FIG. 23, a origin I(0,0) of the pattern is given as a point on a line (z') symmetrical to the optical axis (104) of the incident light beam with respect to the first plane, i.e., the lilne (z') is present on the third plane 103. On the other hand, if the incident light beam is perpendicular to grating 15 (i.e., $\alpha=0$, $z'=z$), the origin I(0,0) is present on the incident light beam.

Some of the diffracted light beams are transferred to third plane 103, and other diffracted light beams are transfrred in any planes other than third plane 103. Some of the diffracted light beams are light beams of, e.g., I(0,0)th and I($\pm$1,0)th orders, and other diffraction light beams are light beams of, e.g., I(0,$\pm$1)th and I($\pm$1,$\pm$1)th orders.

Accordingly, some of the diffracted light beams interfere with the light beams reflected and diffracted by the surface of first diffraction grating 15, but other diffracted light beams do not interfere with the reflected light beam. Thus, one of other diffracted beams is detected. More specifically, a light beam of I(0,$\pm$1)th or I($\pm$1,$\pm$1)th order is detected. The detection result is substantially the same as the detection result shown in FIGS. 8A and 8B. Therefore, when the light beam is obliquely incident on grating 15, a gap can be accurately adjusted in the same maner as in a case wherein the light beams is incident perpendicularly on grating 15.

Figure 24:
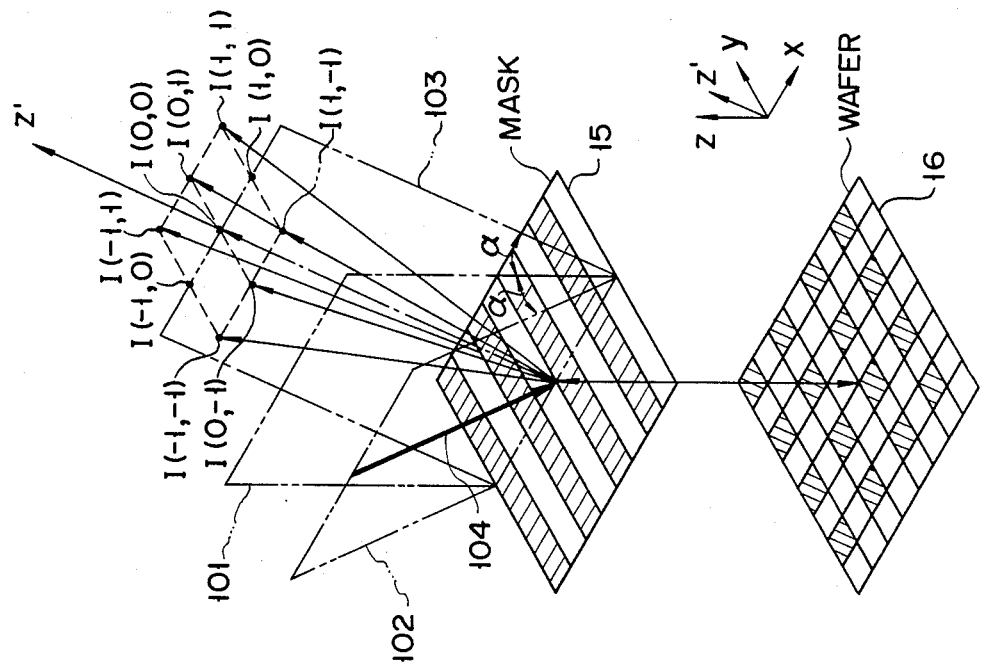

As shown in FIG. 24, the second diffraction grating may be a two-dimensional type grating. In this case, a diffraction pattern of light beams obliquely incident on the grating, is the same as in the case wherein the second diffraction grating is a one-dimensional type grating. The detection result is substantially the same as the detection result shown in FIGS. 11A, 11B 19 20 and 22.

What is claimed is:

1. A method for setting a gap between first and second objects, facing each other, to a predetermined distance, comprising the steps of:
    arranging a first one-dimensional diffraction grating on said first object, the first diffraction grating having parallel bars extending in a first direction, perpendicular to a first plane, to which a second plane inclines at a predetermined angle ($\alpha$), said second plane being symmetrical to a third plane with respect to said first plane;
    arranging a second one-dimensional diffraction grating on said second object, the second diffraction grating having parallel bars extending in a second direction perpendicular to the first direction;
    irradiating said first diffraction grating with light beam emitted from a light source, the light beam having an optical axis present in the second plane, so that the light beam is diffracted and transmitted through the first diffraction grating, and first diffracted light beams are emerged from said first diffraction grating;
    transferring the first diffracted light beams to said second diffraction grating, so that the first diffracted light beams are diffracted and reflected by the second diffraction grating, and second diffracted light beams are emerged from said second diffraction grating;
    transferring the second diffracted light beams to said first diffraction grating, so that the second diffracted light beams are diffracted and transmitted through the first diffraction grating, third diffracted light beams are emerged from said first diffraction grating, some of the third diffracted light beams are transferred in the third plane, and the other third diffracted light beams are transferred in any planes other than the third plane;
    detecting one of the other third diffracted light beams; and
    adjusting a distance of the gap between said first and second objects, in accordance with an intensity of the detected diffracted light beam, and setting the gap to a predetermined distance.

2. The method according to claim 1, wherein said first object is a mask and said second object is a wafer.

3. The method according to cliam 1, wherein the angle ($\alpha$) at which said first plane inclines to said second plane is 0°.

4. The method according to claim 1, wherein if the second direction of the second diffraction grating is given as x direction, the first direction of the first diffraction grating is given as y direction, and a point on a line symmetrical to the optical axis of the incident light beam with respect to the first plane is given as an origin,
    in the step of detecting diffracted light beam, one of the other third diffracted light beams is picked up.

5. The method according to claim 1, wherein in the step of detecting diffracted light beam, one of ($\pm$,$\pm$1)th orders light beams of the other third diffracted light beams is picked up.

6. The method according to claim 1, wherein two sets of said first and second diffraction gratings are arranged on the first and second objects, respectively.

7. The method according to claim 6, wherein said two first diffraction gratings have different pitches and said two second diffraction gratings have different pitches;
    in the step of detecting diffracted light beam, one of the other third diffracted light beams diffracted by one set of said first and second diffraction gratings, and one of the other third diffracted light beams diffracted by the other set of said first and second diffraction gratings, are picked up individually, and a difference between the intensities of these two diffracted light beams is calculated, whereby the distance of the gap between said first and second objects is adjusted, based on the difference between the intensities.

8. The method according to claim 6, wherein said two first diffraction gratings have different pitches;
    light beam emitted from said light source is alternately radiated on said two sets of first and second diffraction gratings, for each predetermined period of time;
    in the step of detecting diffracted light beam, one of the other third diffracted light beams diffracted by one set of said first and second diffraction gratings, and one of the other third diffracted light beam diffracted by the other set of said first and second diffraction gratings, are alternately picked up for each predetermined period of time; and a difference between the intensities of these two diffracted light beams is calculated, whereby the distance of the gap between said first and second objects is adjusted, based on the difference between the intensities.

9. The method according to claim 2, wherein an optical projection system for projecting an image of a circuit pattern is arranged between said mask and said wafer;

the first diffracted light beams transmitted through said first diffraction grating are transferred to said second diffraction grating, through said optical projection system; and the second diffracted light beams diffracted and reflected by said second diffraction grating are transferred to said first diffraction grating, through said optical projection system.

10. A method for setting a gap between first and second objects, facing each other, to a predetermined distance, comprising the steps of:

arranging a first one-dimensional diffraction grating on said first object, the first diffraction grating having parallel bars extending in a first direction perpendicular to a first plane, to which a second plane inclines at a predetermined angle ($\alpha$), said second plane being symmetrical to a third plane with respect to said first plane;

arranging a second two-dimensional diffraction grating on said second object, the second diffraction grating having cross-bars, one bar of cross-bars extending in a second direction perpendicular to the first direction wherein the pitches of the first diffraction grating and the pitches of the second diffraction grating in the second direction are equal to each other;

irradiating said first diffraction grating with light beam emitted from a light source, the light beam having an optical axis present in the second plane, so that the light beam is diffracted and transmitted through the first diffraction grating, and first diffracted light beams are emerged from said first diffraction grating;

transferring the first diffracted light beams to said second diffraction grating, so that the first diffracted light beams are diffracted and reflected by the second diffraction grating, and second diffracted light beams are emerged from said second diffraction grating;

transferring the second diffracted light beams to said first diffraction grating, so that the second diffracted light beams are diffracted and transmitted through the first diffraction grating, third diffracted light beams are emerged from said first diffraction grating, some of the third diffracted light beams are transferred in the third plane, and the other third diffracted light beams are transferred in and planes other than the third plane;

detecting one of the other third diffracted light beams; and adjusting a distance of the gap between said first and second objects, in accordance with an intensity of the detected diffracted light beam, and setting the gap to a predetermined distance.

11. The method according to claim 10, wherein said first object is a mask and said second object is a wafer.

12. The method according to cliam 10, wherein the angle ($\alpha$) at which sasid first plane inclines to said second plane is 0°.

13. The method according to claim 10, wherein if the second direction of the second diffraction grating is given as x direction, the first direction of the first diffraction grating is given as y direction, and a point on a line symmetrical to the optical axis of the incident light beam with respect to the first plane is given as an origin, in the step of detecting diffracted light beam, one of the (0, ±1)th orders light beam of the other third diffracted light beam is picked up.

14. The method according to claim 10, wherein two sets of said first and second diffraction gratings are arranged on the first and second objects, respectively.

15. The method according to claim 14, wherein if a distance between said two first diffraction gratings is given as u, a distance between said two second diffraction gratings is given as v, the diffraction pitch in an x direction of said first and second diffraction gratings is given as $p_x$, and N is an arbitrary integer, u and v can be defined as:

$$v = u + \{(2N+1)/2\} \cdot P_x$$

in the step of detecting diffracted light beam, one of the other third diffracted light beams diffracted by one set of said first and second diffraction gratings, and one of the other third diffracted light beams diffracted by the other set of said first and second diffraction gratings are separately picked up, and a difference between the intensities of these two diffracted light beams is calculated, whereby the distance of the gap between said first and second objects is adjusted, based on the difference between the intensities.

16. The method according to claim 15, wherein said two first diffraction gratings have the same pitch; said two second diffraction gratings have different pitches in the y direction; and in the step of detecting diffracted light beam, one of the other third diffracted light beams diffracted by one set of said first and second diffraction gratings, and the same order one of the other third diffracted light beams diffracted by the other set of said first and second diffraction gratings are separately picked up.

17. The method according to claim 14, wherein said two first diffraction gratings have the same pitch;

light beam emitted from said light source is alternately radiated on said two sets of first and second diffraction gratings, for each predetermined period of time;

in the step of detecting diffracted light beam, one of the other third diffracted light beams diffracted by one set of said first and second diffraction gratings, and the same order one of the other third diffracted light beams diffracted by the other set of said first and second diffraction gratings, are alternately picked up for each predetermined period of time; and a difference between intensities of the two diffracted light beams is calculated, whereby the distance of the gap between said first and second objects is adjusted, based on the difference between the intensities.

18. The method according to claim 14, wherein the pitch of said second diffraction grating in one direction is equal to that in the other direction.

19. The apparatus for setting a gap between first and second objects, facing each other, to a predetermined distance, comprising:

a light source for emitting a light beam;

a first one-dimensional diffraction grating which is arranged on said first object, the first diffraction grating having parallel bars extending in a first direction, perpendicular to a first plane, to which a second plane inclines at a predetermined angle ($\alpha$), said second plane being symmetrical to a third plane with respect to said first plane, the first diffraction grating receiving the light beam present in the second plane, so that the light beam is diffracted and transmitted through the first diffraction grating, and first diffracted light beams are emerged from said first diffraction grating;

a second one-dimensional diffraction grating which is arranged on said second object, the second diffraction grating having parallel bars extending in a second direction perpendicular to the first direction, the first diffracted light beams being transferred from the first diffraction grating to the second diffraction grating, so that the first diffracted light beams are diffracted and reflected by the second diffraction grating, second diffracted light beams are emerged from the second diffraction grating, and the second diffracted light beams from the second diffraction grating to the first diffraction grating, so that the second diffracted light beams are diffracted and transmitted through the first diffraction grating, third diffracted light beams are emerged from said first diffraction grating, some of the third diffracted light beams are transferred in the third plane, and the other third diffracted light beams are transferred in any planes other than the third planes;

detecting means for detecting one of the other third diffracted light beams; and gap-adjusting means for adjusting the distance of the gap between said first and second objects, in accordance with the intensity of the detected diffracted light beam, and setting the gap to a predetermined distance.

20. The apparatus according to claim 19, wherein said first object is a mask and said second object is a wafer.

21. The apparatus according to claim 19, wherein the angle ($\alpha$) at which said first plane inclines to said second plane is 0°.

22. The apparatus according to claim 19, wherein if the second direction of the second diffraction grating is given as x direction, the first direction of the first diffraction grating is given as y direction, and a point on a line symmetrical to the optical axis of the incident light beam with respect to the first plane is given as an origin, and said detecting means includes pickup means for picking up one of the $(0, \pm 1)$th orders light beams of the other third light beams.

23. The apparatus according to claim 19, wherein said detecting means for detecting the diffracted light beam includes pickup means for picking up one of the $(\pm 1, \pm 1)$th orders light beams of the other third diffracted light beams.

24. The apparatus according to claim 19, wherein said detecting means includes a mirror for reflecting one of the other third light beams and a photosensor for converting the diffracted light beam reflected by said mirror, into an electrical signal, and said gap-adjusting means includes a signal processing circuit for processing the electrical signal and producing a control signal, and mask-moving means for adjusting the gap between said mask and said wafer.

25. The apparatus according to claim 19, wherein two sets of said first and second diffraction gratings are arranged on the first and second objects, respectively.

26. The apparatus according to claim 19, wherein said two first diffraction gratings have different pitches, and said two second diffraction gratings have different pitches, said detecting means includes pickup means for separately picking up one of the other third diffracted light beams diffracted by one set of said first and second diffraction gratings, and one of the other third light beams diffracted by the other set of said first and second diffraction gratings, and said gap-adjusting means includes calculation means for calculating a difference between intensities of the two diffracted light beams.

27. The apparatus according to claim 19, wherein said two first diffraction gratings have different pitches, said detecting means includes pickup means for alternately picking up one of the other third diffracted light beams diffracted by one set of said first and second diffraction gratings, and one of the other third diffracted light beams diffracted by the other set of said first and second diffraction gratings for each predetermined period of time, when light beam emitted from said light source is alternately radiated on said two sets of first and second diffraction gratings for each predetermined period of time, and said gap-adjusting means includes calculation means for calculating a difference between intensities of the two diffracted light beam.

28. The apparatus according to claim 20, wherein an optical projection system for projecting an image of a circuit pattern is arranged between said mask and said wafer.

29. The apparatus for setting a gap between first and second objects, facing each other, to a predetermined distance, comprising:

a light source for emitting a light beam;

a first one-dimensional diffraction grating which is arranged on said first object, the first diffraction grating having parallel bars extending in a first direction, perpendicular to e first plane, to which a second planes inclines at a predetermined angle ($\alpha$), said second plane being symmetrical to a third plane with respect to said first plane, the first diffraction grating receiving the light beam which has an optical axis present in the second plane, so that the light beam is diffracted and transmitted through the first diffraction grating, and first diffracted light beams are emerged from said first diffraction grating;

a second two-dimensional diffraction grating which is arranged on said second object, the second diffraction grating having cross-bars, one bar of cross-bars extending in a second direction perpendicular to the first direction, the first diffracted light beams being transferred from the first diffraction grating to the second diffraction grating, so that the first diffracted light beams are diffracted and reflected by the second diffraction grating, second diffracted light beams are emerged from the second diffraction grating, and the second diffracted grating to the first diffraction grating, so that the second diffracted light beams are diffracted and transmitted through the first diffraction grating, third diffracted light beams are emerged from said first diffraction grating, some of the third diffracted light beams are transferred in the third plane, and the other third diffracted light bems are transferred in any planes other than the third plane wherein the pitches of the first diffraction grating and the pitches of the second diffraction grating in the second direction are equal to each other;

detecting means for detecting one of the other third diffracted light beams; and gap-adjusting means for adjusting a distance of a gap between said first and second objects, in accordance with an intensity of the detected diffracted light beam, and setting the gap to a predetermined distance.

30. The apparatus according to claim 29, wherein said first object is a mask and said second object is a wafer.

31. The apparatus according to claim 29, wherein the angle ($\alpha$) at which said first plane inclines to said second plane is 0°.

32. The apparatus according to claim 29, wherein if the second direction of the second diffraction grating is given as x direction, the first direction of the first diffraction grating is given as y direction and a point on a line symmetrical to the optical axis of the incident light beam with respect to the first plane is given as an origin, and said detecting means includes pickup means for picking up one of the $(0, \pm 1)$th orders light beams of the other third diffracted light beams.

33. The apparatus according to claim 29, wherein said detecting means includes a mirror for reflecting one of the other third diffracted light beams and a photosensor for converting the diffracted light beams reflected by said mirror, into an electrical signal, and said gap adjusting means includes a signal processing circuit for processing the electrical signal and producing a control signal, and mask moving means for adjusting the gap between said mask and said wafer.

34. The apparatus according to claim 29, wherein two sets of said first and second diffraction gratings are arranged on first and second objects, respectively.

35. The apparatus according to claim 34, wherein if a distance between said two first diffraction gratings is given as u, a distance between said two second diffraction gratings is given as v, the diffraction pitch in an x direction of said first and second diffraction gratings is given as $p_x$, and N is an arbitrary integer, u and v can be defined as:

$$v = u + \{(2N+1)/2\} \cdot p_x$$

said detecting means includes pickup means for separately picking up one of the other third diffracted light beams diffracted by one set of said first and second diffracton gratings, and one of the other third diffracted light beams diffracted by the other set of said first and second diffactin gratings, and said gap adjusting means includes calculation means for calculating a difference between intensities of the two diffracted light beams.

36. The apparatus according to claim 35, wherein said first diffraction gratings have the same pitch and said two second diffraction gratings have different pitches in the y direction, and said detecting means includes pickup means for separately picking up one of the other third diffracted light beams diffracted by one set of said first and second diffraction gratings, and the same one of the other third diffracted light beams diffracted by the other set of said first and second diffraction gratings.

37. The apparatus according to claim 34, wherein said two first diffraction gratings have the same pitch, said detecting means includes pickup means for alternately picking up one of the other third diffracted light beams diffracted by one set of said first and second diffraction gratings, and one of the other third diffracted light beams diffracted by the other set of said first and second diffraction gratings, for each predetermined period of time, when light beam emitted from said light source is alternately radiated on said two sets of said first and second diffraction gratings for each predetermined period of time, and said gap adjusting means includes calculation means for calculating a difference between intensities of the two diffracted light beams.

38. The apparatus according to claim 34, wherein the diffraction pitch of said second diffraction grating in one direction is substantially equal to that in the other direction.

39. A method for setting a gap between first and second objects, facing each other, to a predetermined distance, comprising the steps of:

arranging two sets of first-type one-dimensional diffraction grating on said first object, the first-type diffraction grating having parallel bars extending in a first direction perpendicular to a first plane, to which a second plane inclines at a predetermined angle ($\alpha$), said second plane being symmetrical to a third plane with respect to said first plane;

arranging two sets of a second-type two-dimensional diffraction grating on said second object, the second-type diffraction grating having cross-bars, with one bar of said cross-bars extending in a second direction perpendicular to the first direction;

irradiating said first-type diffraction gratings with light beam emitted from a light source, the light beam having an optical axis present in the second plane, so that the light beam is diffracted and transmitted through the first-type diffraction gratings, and first diffracted light beams are emerged from said first diffraction gratings;

transferring the first diffracted light beams to said second-type diffraction gratings, so that the first diffracted light beams are diffracted and reflected by the second-type diffraction gratings, and second diffracted light beams are emerged from said second diffraction gratings;

transferring the second diffracted light beams to said first-type diffraction gratings, so that the second diffracted light beams are diffracted and transmitted through the first-type diffraction gratings, third diffracted light beams are emerged from said first-type diffraction gratings, some of the third diffracted light beams are the intensities.

40. The apparatus for setting a gap between first and second objects, facing each other, to a predetermined distance, comprising:

a light source for emitting a light beam;

a set of two, first-type one-dimensional diffraction gratings which are arranged on said first object, the first-type diffraction gratings having parallel bars extending in a first direction, perpendicular to a first plane, to which a second plane inclines at a predetermined angle ($\alpha$), said second plane being symmetrical to a third plane with respect to said first plane, the first-type diffraction gratings receiving the light beam which has an optical axis present in the second plane, so that the light beam is diffracted and transmitted through the first-type diffraction gratings, and first diffracted light beams are emerged from said first-type diffraction gratings;

a set of two second-type two-dimensional diffraction gratings which are arranged on said second object, the second-type diffraction gratings having crossbars, with one bar of said cross-bars extending in a second direction perpendicular to the first direction, the first diffracted light beams being transferred from the first-type diffraction gratings to the second-type diffraction gratings, so that the first diffracted light beams are diffracted and reflected by the second-type diffraction gratings, second diffracted light beams are emerged from the second-type diffraction gratings, and the second diffracted light beams from the second-type diffraction gratings to the first-type diffraction gratings, so that the second diffracted light beams are diffracted and transmitted through the first-type diffraction gratings, third diffracted light beams are emerged from said first-type diffraction gratings, some of the third diffracted light beams are transferred in the third plane, and the other third diffracted light beams are transferred in and planes other than the third plane;

detecting means for detecting one of the other third diffracted light beams;

gap-adjusting means for adjusting a distance of a gap between said first and second objects, in accordance with an intensity of the detected diffracted light beam, and setting the gap to be a predetermined distance; and wherein if a distance between said two first diffraction gratings is given as u, a distance between said two second diffraction gratings is given as v, the diffraction pitch in an x direction of said first and second diffraction gratings is given as Px, and N is an arbitrary integer, u and v can be defined as:

$$v = u + \{(2N+1)/2\} \cdot P_x$$

said detecting means includes pickup means for separately picking up one of the other third diffracted light beams diffracted by one set of said first and second diffraction gratings, and one of the other third diffracted light beams diffracted by the other set of said first and second diffraction gratings, and said gap adjusting means includes calculation means for calculating a difference between intensities of the two diffracted light beams.

* * * * *